US012477898B2

(12) United States Patent
Kinjo et al.

(10) Patent No.: US 12,477,898 B2
(45) Date of Patent: Nov. 18, 2025

(54) OLED INCLUDING ORGANIC LAYERS INCLUDING OVERLAPPING EDGES

(71) Applicant: Magnolia White Corporation, Tokyo (JP)

(72) Inventors: Hiroumi Kinjo, Tokyo (JP); Hayata Aoki, Tokyo (JP); Masakazu Gunji, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 722 days.

(21) Appl. No.: 17/579,732

(22) Filed: Jan. 20, 2022

(65) Prior Publication Data

US 2022/0238829 A1    Jul. 28, 2022

(30) Foreign Application Priority Data

Jan. 22, 2021   (JP) .................. 2021-008990

(51) Int. Cl.

| | |
|---|---|
| H01L 51/50 | (2006.01) |
| H01L 27/32 | (2006.01) |
| H01L 51/00 | (2006.01) |
| H01L 51/56 | (2006.01) |
| H10K 50/11 | (2023.01) |
| H10K 50/17 | (2023.01) |
| H10K 50/18 | (2023.01) |
| H10K 59/121 | (2023.01) |
| H10K 59/122 | (2023.01) |
| H10K 71/16 | (2023.01) |

(Continued)

(52) U.S. Cl.
CPC ........... *H10K 59/121* (2023.02); *H10K 50/11* (2023.02); *H10K 50/17* (2023.02); *H10K 50/171* (2023.02); *H10K 50/18* (2023.02); *H10K 50/181* (2023.02); *H10K 59/122* (2023.02); *H10K 71/164* (2023.02); *H10K 71/166* (2023.02); *H10K 59/88* (2023.02); *H10K 2101/40* (2023.02)

(58) Field of Classification Search
CPC ..................................................... H10K 50/11
See application file for complete search history.

(56) References Cited

U.S. PATENT DOCUMENTS

| | | | |
|---|---|---|---|
| 2004/0160170 | A1 | 8/2004 | Sato et al. |
| 2010/0193817 | A1 | 8/2010 | Amamiya et al. |
| 2013/0001607 | A1 | 1/2013 | Goda |

(Continued)

FOREIGN PATENT DOCUMENTS

| | | | |
|---|---|---|---|
| JP | 2004-207217 A | | 7/2004 |
| JP | 2010033972 A | * | 2/2010 |

(Continued)

OTHER PUBLICATIONS

Office Action issued on Nov. 29, 2024, in corresponding Chinese Application No. 202210065992.0, 18 pages.

(Continued)

*Primary Examiner* — Peter Bradford
(74) *Attorney, Agent, or Firm* — Maier & Maier, PLLC

(57) ABSTRACT

According to one embodiment, a display device includes a first electrode, an organic layer disposed on the first electrode, and a second electrode covering the organic layer. The organic layer includes a first layer having a first edge portion and a second layer between the first layer and the second electrode. The second layer covers the first edge portion.

11 Claims, 17 Drawing Sheets

(51) Int. Cl.
   *H10K 59/88*   (2023.01)
   *H10K 101/40*  (2023.01)

(56) References Cited

U.S. PATENT DOCUMENTS

2017/0365812 A1* 12/2017 Choung ................. H10K 50/15
2018/0366524 A1* 12/2018 Bang ..................... H10K 71/60
2020/0119114 A1*  4/2020 Kim ..................... H10K 59/122
2020/0243790 A1*  7/2020 Lee ..................... H10K 50/8445

FOREIGN PATENT DOCUMENTS

JP      2018101761 A      6/2018
KR    20210072451 A  *  6/2021

OTHER PUBLICATIONS

Office Action issued on Sep. 10, 2024, in corresponding Japanese Application No. 2021-008990, 9 pages.

* cited by examiner

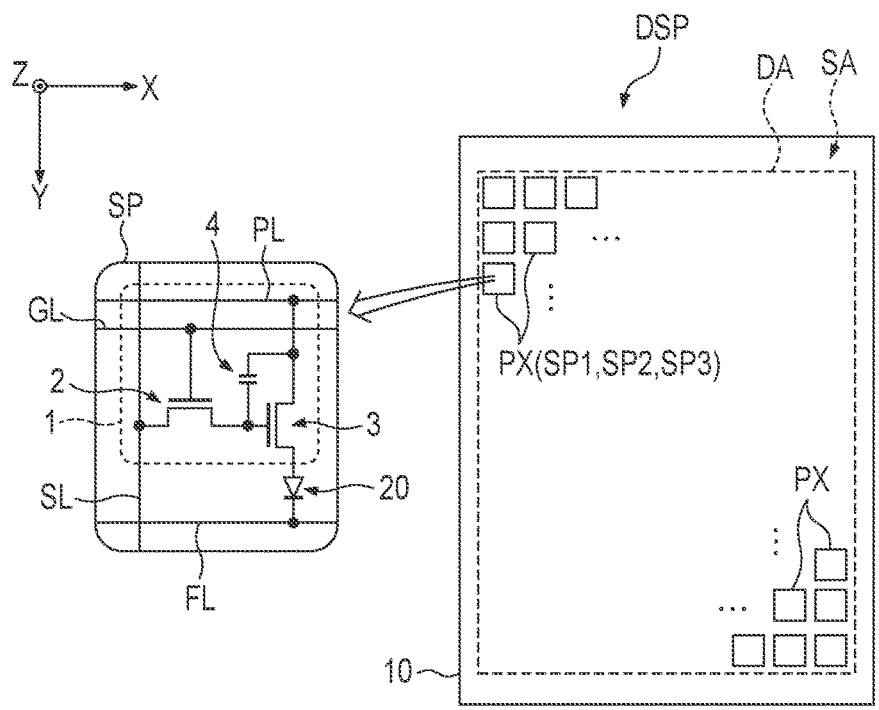
F I G. 1
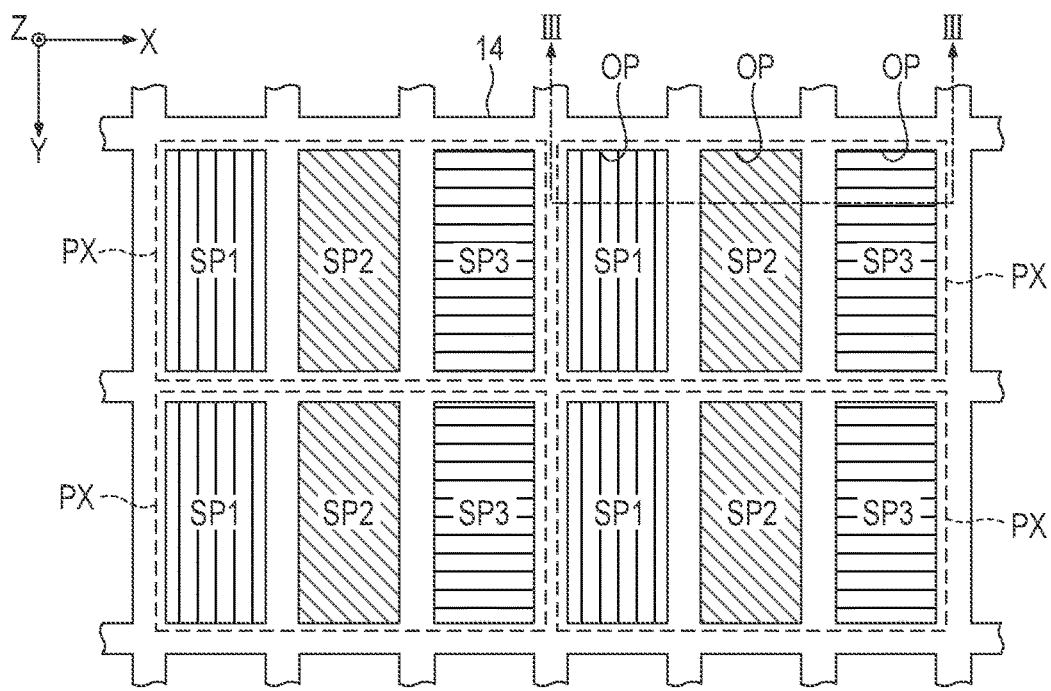
F I G. 2

OLED INCLUDING ORGANIC LAYERS INCLUDING OVERLAPPING EDGES

CROSS-REFERENCE TO RELATED APPLICATIONS

This application is based upon and claims the benefit of priority from Japanese Patent Application No. 2021-008990, filed Jan. 22, 2021, the entire contents of which are incorporated herein by reference.

FIELD

Embodiments described herein relate generally to a display device.

BACKGROUND

In recent years, a display device to which an organic light emitting diode (OLED) is applied as a display element has been put into practical use. This display element includes a pair of electrodes and an organic layer interposed between these electrodes. Such organic layer is formed, for example, by a vacuum vapor deposition method.

For example, when an organic layer in which a plurality of functional layers are stacked is formed, edge portions of the functional layers may not be aligned at a peripheral portion of the organic layer, which may lead to degradation in performance of the display element.

BRIEF DESCRIPTION OF THE DRAWINGS

FIG. 1 is a diagram illustrating a configuration example of a display device according to a first embodiment.

FIG. 2 is a diagram illustrating an example of a layout of sub-pixels according to the first embodiment.

DETAILED DESCRIPTION

Figure 3:
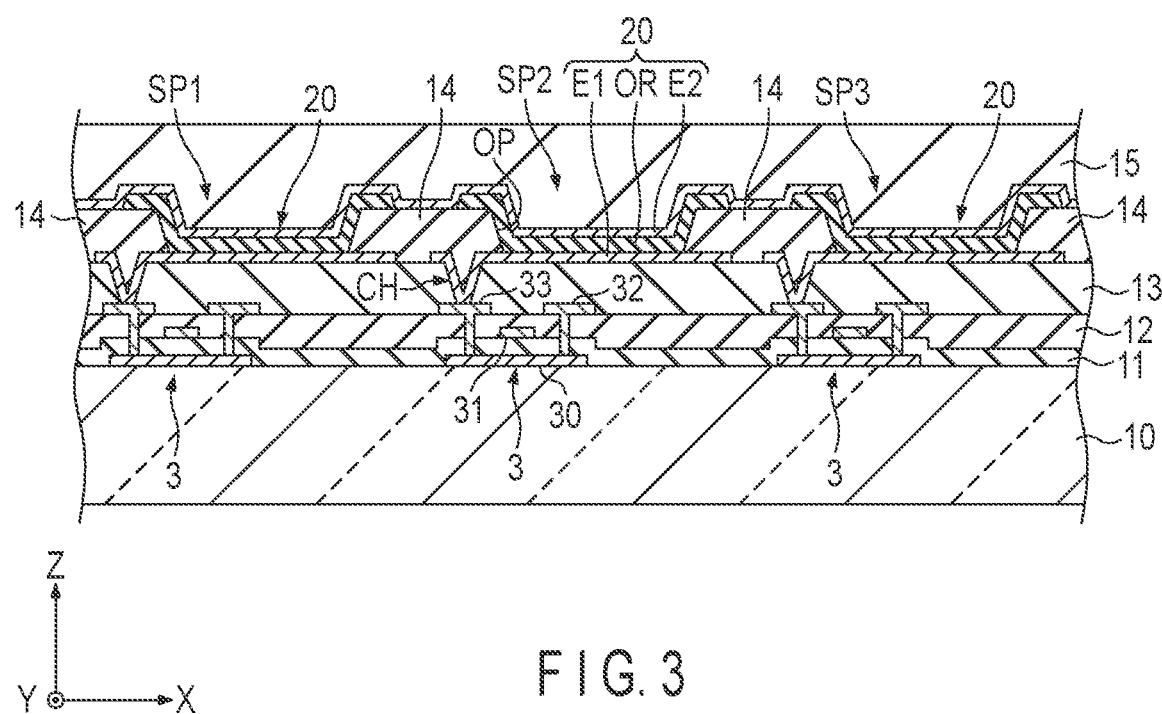
FIG. 3 is a schematic cross-sectional view of the display device along line of FIG. 2.

In general, according to one embodiment, a display device comprising a first electrode, an organic layer disposed on the first electrode, and a second electrode covering the organic layer. The organic layer includes a first layer having a first edge portion and a second layer between the first layer and the second electrode. The second layer covers the first edge portion.

According to another embodiment, a display device comprising a first electrode, a rib having an opening overlapping with the first electrode and covering a peripheral portion of the first electrode, an organic layer that is in contact with the first electrode through the opening and has an edge portion located on the rib, and a second electrode covering the organic layer. At least one of a plurality of layers constituting the organic layer includes a first region that overlaps with the opening and in which a dopant is distributed at a first concentration, and a second region located on the rib and in which the dopant is distributed at a second concentration lower than the first concentration.

According to these structures, it is possible to provide a display device capable of suppressing performance degradation of a display element.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane, and a plane defined by the X axis and the Z axis is referred to as an X-Z plane. Further, viewing towards the X-Y plane is referred to as planar view.

A display device DSP according to a present embodiment is an organic electroluminescence display device including an organic light emitting diode (OLED) as a display element, and can be mounted on a television, a personal computer, an in-vehicle device, a tablet terminal, a smartphone, or a mobile phone terminal, as examples.

First Embodiment

FIG. 1 is a diagram illustrating a configuration example of a display device DSP according to a first embodiment. The display device DSP has a display region DA for displaying an image and a peripheral region SA outside the display region DA on an insulating base material 10. The base material 10 may be glass or a flexible resin film.

The display region DA includes a plurality of pixels PX arrayed in a matrix in a first direction X and a second direction Y. Each of the pixels PX includes a plurality of sub-pixels SP. In one example, a pixel PX comprises a red sub-pixel SP1, a green sub-pixel SP2, and a blue sub-pixel SP3. The pixel PX may include four or more sub-pixels in which sub-pixel of other colors such as white are added in addition to the sub-pixels of the above three colors.

The sub-pixel SP includes a pixel circuit 1 and a display element 20 driven by the pixel circuit 1. The pixel circuit 1 includes a pixel switch 2, a drive transistor 3, and a capacitor 4. The pixel switch 2 and the drive transistor 3 are switching elements including, for example, a thin-film transistor.

In the pixel switch 2, a gate electrode is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of a source electrode and a drain electrode is connected to a power supply line PL and the capacitor 4, and the other is connected to an anode of the display element 20. The configuration of the pixel circuit 1 is not limited to the illustrated example.

The display element 20 is an organic light emitting diode (OLED) as a light emitting element. For example, the sub-pixel SP1 has a display element that emits light corresponding to a red wavelength, the sub-pixel SP2 has a display element that emits light corresponding to a green wavelength, and the sub-pixel SP3 has a display element that emits light corresponding to a blue wavelength. The configuration of the display element 20 will be described later.

FIG. 2 is a diagram illustrating an example of a layout of the sub-pixels SP1, SP2, and SP3. Here, attention is paid on four pixels PX. In each pixel PX, the sub-pixels SP1, SP2, and SP3 are arranged in the first direction X in this order. That is, in the display region DA, a column including a plurality of the sub-pixels SP1 arranged in the second direction Y, a column including a plurality of the sub-pixels SP2 arranged in the second direction Y, and a column including a plurality of the sub-pixels SP3 are alternately disposed in the first direction X.

A rib 14 is disposed at boundaries of the sub-pixels SP1, SP2, and SP3. In the example of FIG. 2, the rib 14 has a grid pattern having portions located between the sub-pixels adjacent to each other in the first direction X and portions located between the sub-pixels adjacent to each other in the second direction Y. The rib 14 forms an opening OP over each of the sub-pixels SP1, SP2, and SP3.

The outer shapes of the sub-pixels SP1, SP2, and SP3 illustrated in FIG. 2 correspond to, for example, an outer shape of a light emitting region of the display element 20, but they are illustrated in a simplified manner and do not necessarily reflect the actual shape.

FIG. 3 is a schematic cross-sectional view of the display device DSP along line of FIG. 2. In FIG. 3, the drive transistor 3 and the display elements 20 are illustrated as elements disposed in the sub-pixels SP1, SP2, and SP3, and other elements are omitted.

The display device DSP includes the above-mentioned base material 10, insulating layers 11, 12, and 13, the above-mentioned rib 14, and a sealing layer 15. The insulating layers 11, 12, and 13 are stacked in a third direction Z on the base material 10. For example, the insulating layers 11 and 12 are made of an inorganic material, and the insulating layer 13, rib 14 and sealing layer 15 are made from organic materials.

Each of the drive transistors 3 includes a semiconductor layer 30 and electrodes 31, 32, 33. The electrode 31 corresponds to a gate electrode. One of the electrodes 32 and 33 corresponds to a source electrode, and the other corresponds to a drain electrode. The semiconductor layer 30 is interposed between the base material 10 and the insulating layer 11. The electrode 31 is interposed between the insulating layers 11 and 12. The electrodes 32 and 33 are interposed between the insulating layers 12 and 13 and are in contact with the semiconductor layer 30 through contact holes penetrating the insulating layers 11 and 12.

Each of the display elements 20 includes a first electrode E1, an organic layer OR, and a second electrode E2. The first electrode E1 is an electrode disposed for each sub-pixel SP or for each display element 20, and may be referred to as a pixel electrode, a lower electrode, or an anode. The second electrode E2 is an electrode commonly disposed for a plurality of sub-pixels SP or a plurality of display elements 20, and may be referred to as a common electrode, an upper electrode, or a cathode.

The rib 14 is disposed on the insulating layer 13. Each first electrode E1 is disposed on the insulating layer 13 and overlaps with each opening OP. A peripheral portion of the first electrode E1 is covered with the rib 14. Each first electrode E1 is electrically connected to each electrode 33 through a contact hole CH penetrating the insulating layer 13. For example, the first electrode E1 is formed of a transparent conductive material such as indium tin oxide (ITO) or indium zinc oxide (IZO). The first electrode E1 may be a metal electrode (reflecting electrode) formed of a metal material such as silver or aluminum. Further, the first electrode E1 may be a stacked layer body of a transparent electrode and a metal electrode. For example, the first electrode E1 may be configured as a stacked layer body in which a transparent electrode, a metal electrode, and a transparent electrode are stacked in this order, or may be configured as a stacked layer body having three or more layers.

The organic layer OR is disposed over the rib 14 and is in contact with the first electrode E1 through the opening OP. A peripheral portion of each organic layer OR is located above the rib 14.

The second electrode E2 covers the organic layer OR. In the example of FIG. 3, the second electrode E2 is continuously provided over the sub-pixels SP1, SP2, and SP3. The second electrode E2 is formed of a transparent conductive material such as indium tin oxide or indium zinc oxide. The sealing layer 15 is disposed on the second electrode E2. The sealing layer 15 is formed to be thicker than, for example, the insulating layers 11, 12, 13 or the rib 14, protects the organic layers OR from moisture and the like, and flattens unevenness generated by the rib 14.

Figure 4:
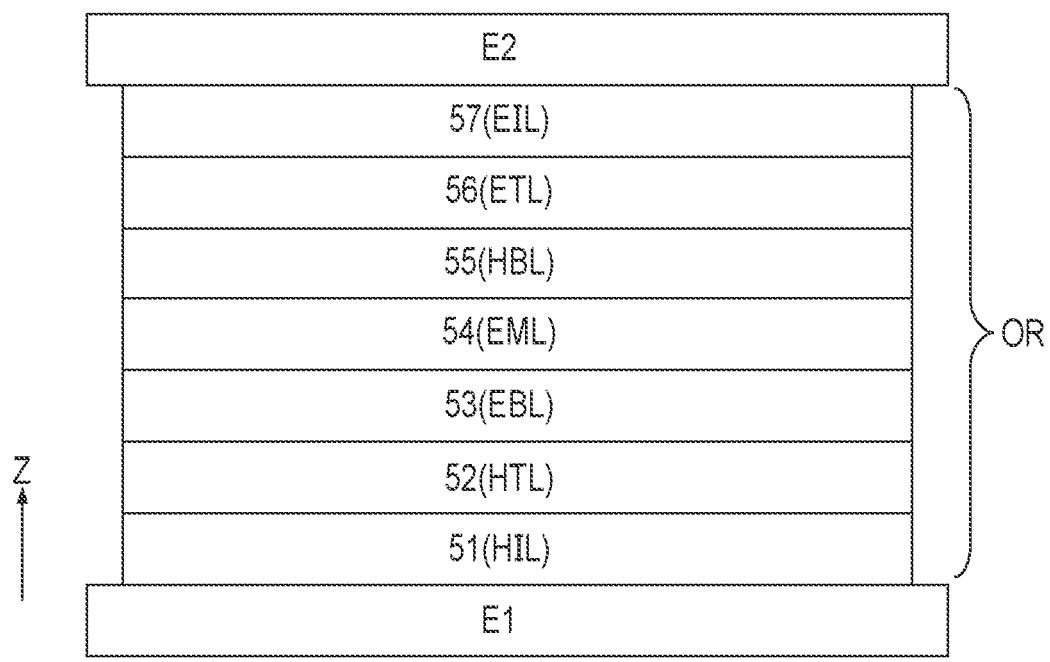
FIG. 4 is a cross-sectional view illustrating an example of a layer structure applicable to an organic layer according to the first embodiment.

FIG. 4 is a cross-sectional view illustrating an example of a layer structure applicable to each of the organic layers OR. For example, the organic layer OR includes a first carrier injection layer 51, a first carrier transport layer 52, a first carrier blocking layer 53, and an emitting layer 54 (EML), a second carrier blocking layer 55, a second carrier transport layer 56 and a second carrier injection layer 57 stacked in this order from the first electrode E1 to the second electrode E2.

In this embodiment, it is assumed that the first electrode E1 is the anode and the second electrode E2 is the cathode. For example, in this case, the first carrier injection layer 51 is a hole-injection layer (HIL) that generates holes, and the first carrier transport layer 52 is a hole-transport layer (HTL) that transports the holes toward the emitting layer 54, the first carrier blocking layer 53 is an electron-blocking layer (EBL) that blocks the movement of electrons, and the second carrier blocking layer 55 is a hole-blocking layer (HBL) that blocks the movement of holes. The second carrier transport layer 56 is an electron-transport layer (ETL) that transports the electrons toward the emitting layer 54, and the second carrier injection layer 57 is an electron-injection layer (EIL) that generates the electrons.

Figure 5:
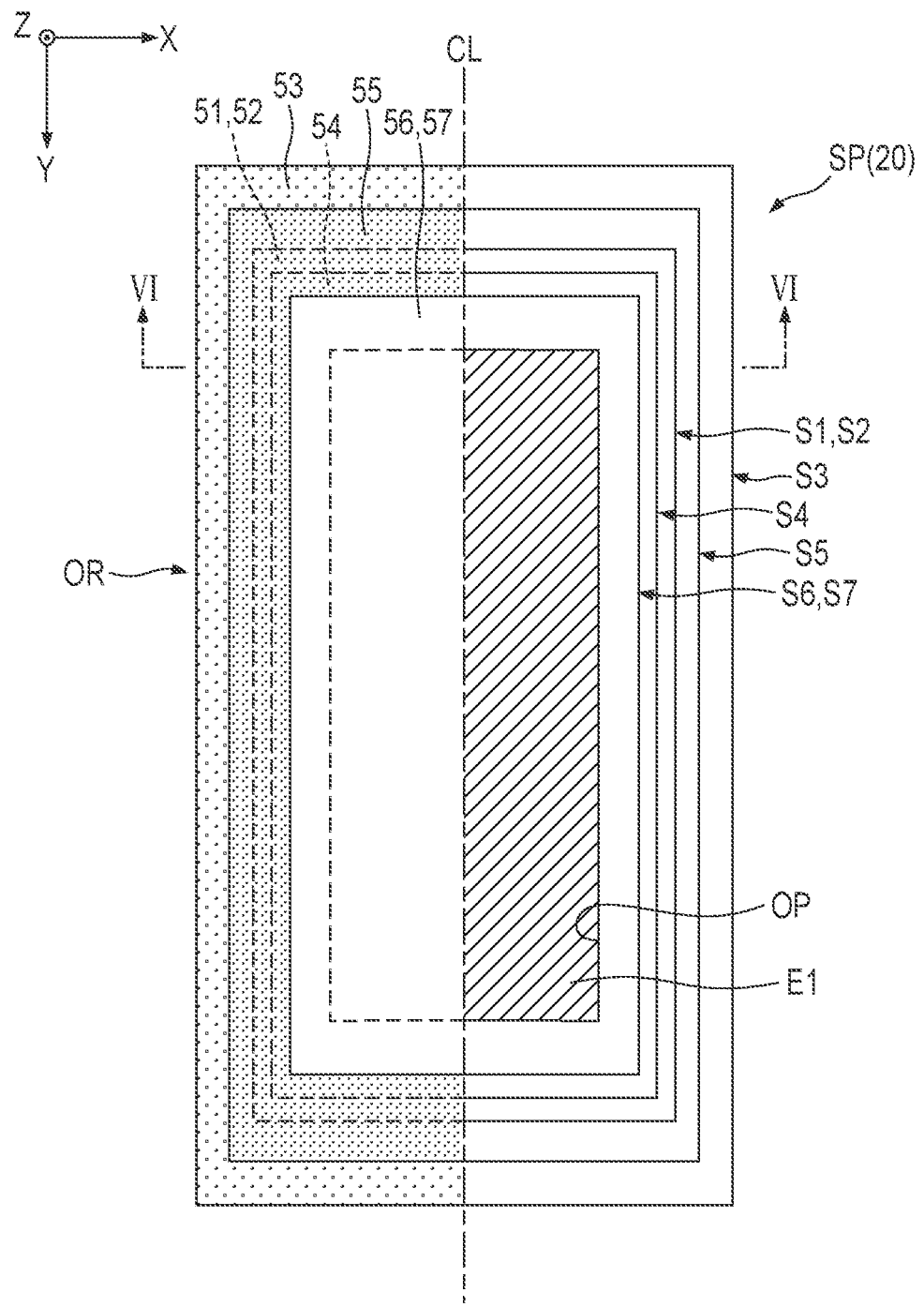
FIG. 5 is a schematic plan view of the organic layer according to the first embodiment.
Figure 6:
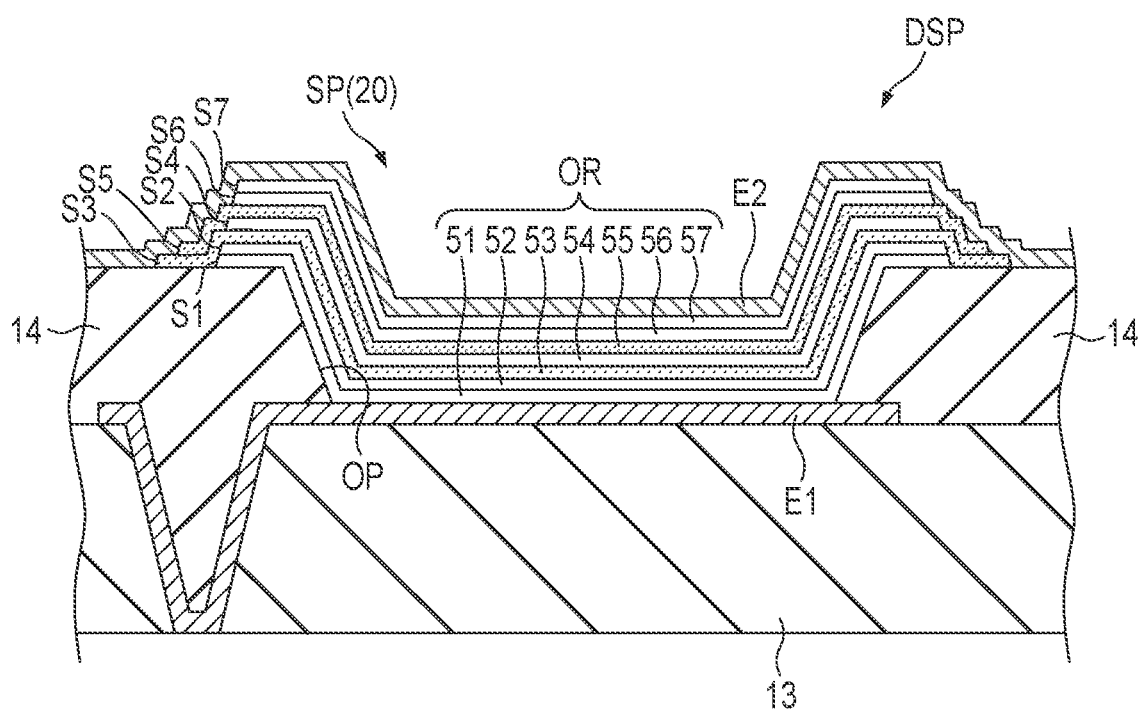
FIG. 6 is a schematic cross-sectional view of the display device along line VI-VI in FIG. 5.

FIG. 5 is a schematic plan view of the organic layer OR. FIG. 6 is a schematic cross-sectional view of the display device DSP along line VI-VI in FIG. 5. In FIG. 5, the shape of the organic layer OR in planar view is illustrated in a region on a left side of a center line CL in a first direction X of a sub-pixel SP (display element 20), and the outer shapes of each layer 51 to 57 of the organic layer OR and the opening OP are illustrated in a region on a right side of the center line CL.

The first carrier injection layer 51 has an edge portion S1, the first carrier transport layer 52 has an edge portion S2, the first carrier blocking layer 53 has an edge portion S3, and the emitting layer 54 has an edge portion S4. The second carrier blocking layer 55 has an edge portion S5, the second carrier transport layer 56 has an edge portion S6, and the second carrier injection layer 57 has an edge portion S7. The edge portions S1 to S7 can be restated as, for example, an edge, an outer circumference, or an outer shape. In the example of FIG. 5, the edge portions S1 and S2 are represented by a single line for simplification of the illustration. Similarly, the edge portions S6 and S7 are also represented by a single line.

In the example of FIG. 5, each layer 51 to 57 and the opening OP are rectangle. That is, the edge portions S1 to S7 and the opening OP each have two sides parallel to the first direction X and two sides parallel to the second direction Y.

In planar view, the edge portions S1 and S2 are located between the edge portion S4 and the edge portion S5, the edge portion S4 is located between the edge portions S1, S2 and the edge portions S6, S7, and the edge portion S5 is located between the edge portions S1, S2 and the edge portion S3, and the edge portions S6, S7 are located between the edge portion S4 and the opening OP. The edge portion S3 corresponds to the outermost circumference of the organic layer OR.

From another point of view, the area of the second carrier blocking layer 55 is greater than the areas of the first carrier injection layer 51, the first carrier transport layer 52, the emitting layer 54, the second carrier transport layer 56, and the second carrier injection layer 57. Further, the area of the first carrier blocking layer 53 is larger than the area of the second carrier blocking layer 55.

As shown in FIG. 6, the edge portions S1 to S7 are all located on the rib 14. The first carrier injection layer 51 is in contact with the first electrode E1 through the opening OP. The first carrier transport layer 52 is generally located above the first carrier injection layer 51.

Most of the first carrier blocking layer 53 is located above the first carrier transport layer 52, and a portion near the edge portion S3 is in contact with the rib 14. That is, the first carrier blocking layer 53 covers the edge portion S1 of the first carrier injection layer 51 and the edge portion S2 of the first carrier transport layer 52.

The emitting layer 54 is generally located on the first carrier blocking layer 53. Most of the second carrier blocking layer 55 is located above the emitting layer 54, and a portion near the edge portion S5 is in contact with the first carrier blocking layer 53. That is, the second carrier blocking layer 55 covers the edge portion S4 of the emitting layer 54.

The second carrier transport layer 56 is generally located above the second carrier blocking layer 55. The second carrier injection layer 57 is generally located above the second carrier transport layer 56.

The edge portions S1 and S2 are not in contact with the second electrode E2 because they are covered with the first carrier blocking layer 53. Further, the edge portion S4 is not in contact with the second electrode E2 because it is covered with the second carrier blocking layer 55.

The edge portion S3 of the first carrier blocking layer 53 and its vicinity are in contact with the second electrode E2. The edge portion S5 of the second carrier blocking layer 55 and its vicinity are in contact with the second electrode E2.

The edge portion S6 is in contact with the second electrode E2. The second carrier injection layer 57 is in contact with the second electrode E2 on the upper surface and the edge portion S7 thereof. In FIG. 6, the cross-section in an X-Z plane defined by the first direction X and the third direction Z is illustrated, but a cross section of a Y-Z plane defined by the second direction Y and the third direction Z also has a same structure.

Next, an example of a method for manufacturing the display device DSP will be described focusing on a step of forming an organic layer OR. Each layer constituting the organic layer OR can be formed, for example, by vacuum vapor deposition using a point vapor deposition source.

Figure 7:
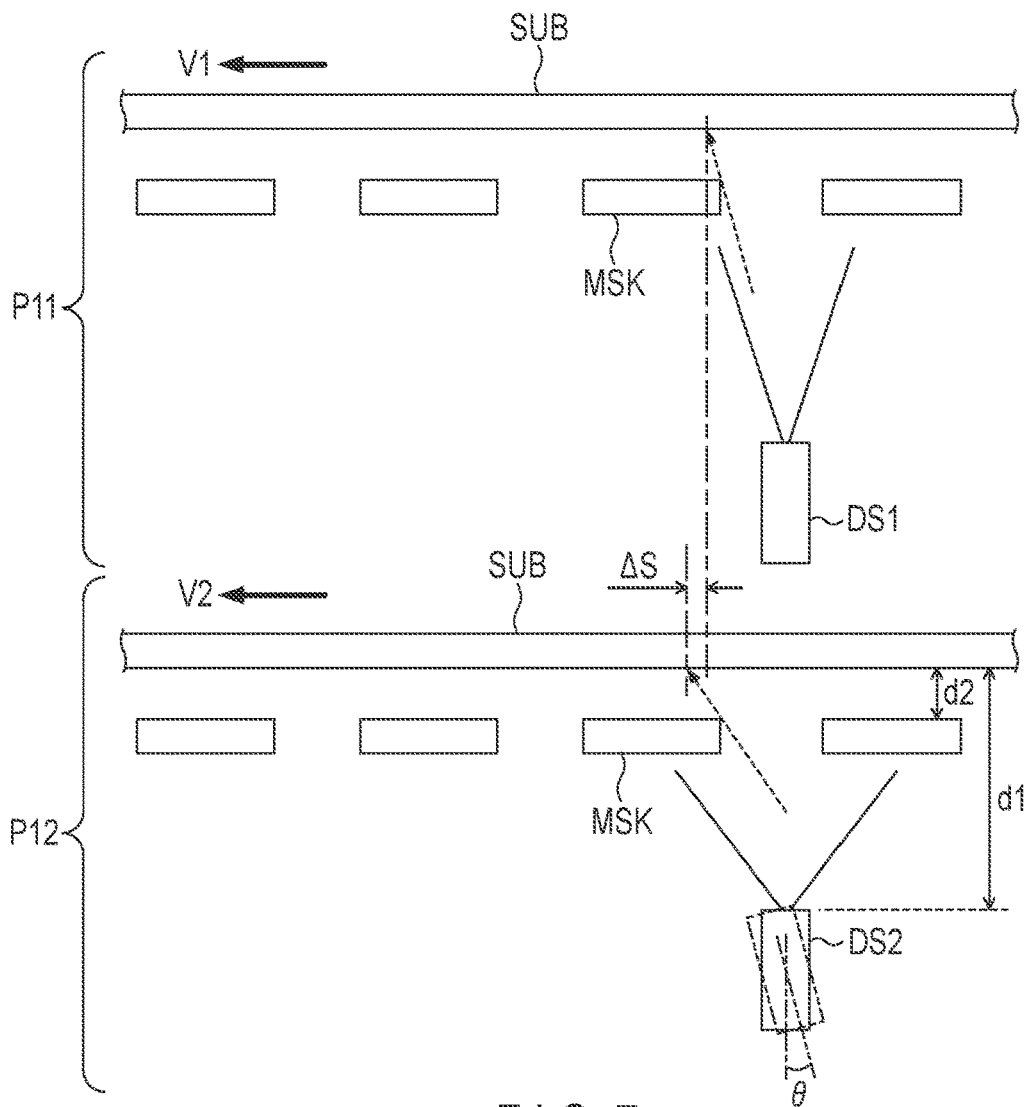
FIG. 7 is a diagram schematically illustrating an example of a method for forming an organic layer according to the first embodiment.

FIG. 7 is a diagram schematically illustrating an example of a method for forming the organic layer OR. This forming method includes a first step P11 and a second step P12. A layer having a relatively small area in the organic layer OR, such as the first carrier injection layer 51, the first carrier transport layer 52, the emitting layer 54, the second carrier transport layer 56, and the second carrier injection layer 57, is formed by the first step P11. A layer having a relatively large area in the organic layer OR, such as the first carrier blocking layer 53 and the second carrier blocking layer 55, is formed by the second step P12.

In each of the first step P11 and the second step P12, masks MSK each having an opening corresponding to each organic layer OR are opposed on the substrate SUB in which a lower layer portion of the display device DSP is formed below the organic layers OR. The masks MSK used in the first step P11 and the second step P12 are the same. In the first step P11, the substrate SUB moves relative to a vapor deposition source DS1 arranged below the masks MSK at a speed V1. In the second step P12, the substrate SUB moves relative to a vapor deposition source DS2 arranged below the masks MSK at a speed of V2.

The range in which molecules from the vapor deposition source DS2 reach the substrate SUB through the opening of each mask MSK in the second step P12 is larger than the range in which molecules from the vapor deposition source DS1 reach the substrate SUB through the opening of each mask MSK in the first step P11. As a result, an area difference ΔS is generated between the layers formed in the first step P11 and the second step P12, respectively. The first step P11 may be referred to as narrow-angle vapor deposition, and the second step P12 may be referred to as wide-angle vapor deposition.

The first step P11 and the second step P12 that generate such an area difference ΔS can be realized by adjusting various parameters related to vapor deposition. Examples of the parameters include a distance d1 between the substrate SUB and the vapor deposition sources DS1 or DS2, a distance d2 between the substrate SUB and the mask MSK, a size of holes provided in the vapor deposition sources DS1 and DS2, and the speeds V1 and V2, an angle θ of the vapor deposition sources with respect to a vertical direction of the substrate SUB, the number of each of the vapor deposition sources DS1 and DS2, and a density at which the vapor deposition sources DS1 and DS2 are arranged.

Figure 8:
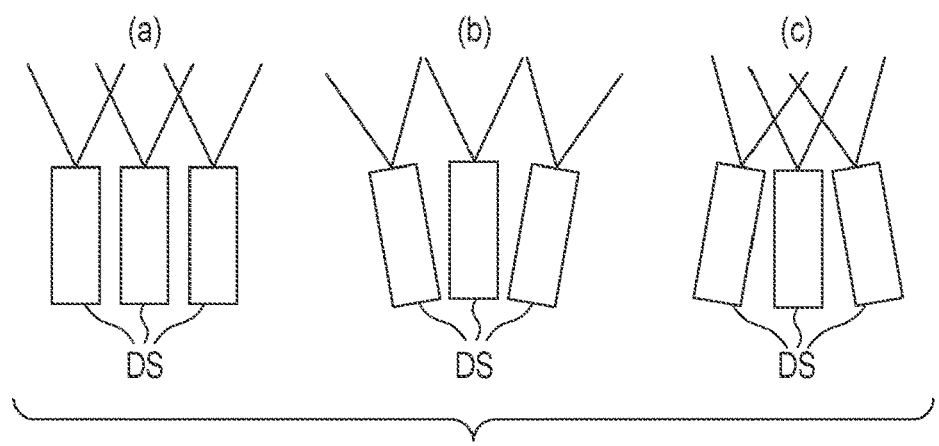
FIG. 8 is a diagram illustrating an example of parameters related to vapor deposition.

FIG. 8 is a diagram illustrating other examples (a), (b), and (c) of the above parameters. In Examples (a), (b), and (c), three vapor deposition source DSs are illustrated, and the angles of these vapor deposition source DSs are different. In Example (a), the three vapor deposition sources DS are parallel to each other. In Example (b), each vapor deposition source DS is tilted so that a distance between the vapor deposition sources DS increases toward a distal part side where molecules are released. In Example (c), each vapor deposition source DS is tilted so that a distance between the vapor deposition sources DSs decreases toward a distal part side where molecules are released.

In the first step P11 and the second step P12, the arrangement mode of the vapor deposition sources DS1 and DS2 may be changed as in the vapor deposition sources DS of Examples (a), (b), and (c). For example, by applying Example (c) to the vapor deposition source DS1 in the first step P11 and applying any of Examples (a) and (b) to the vapor deposition source DS2 in the second step P12, it is possible to generate an area difference ΔS.

Figure 9:
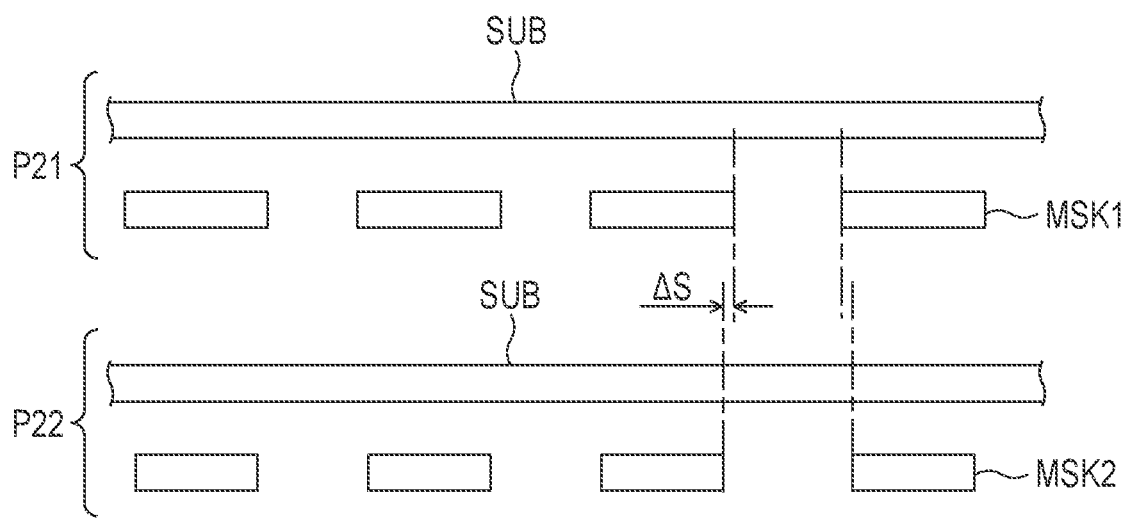
FIG. 9 is a diagram schematically illustrating another example of the method for forming an organic layer according to the first embodiment.

FIG. 9 is a diagram schematically illustrating another example of the method of forming an organic layer OR. This forming method includes a first step P21 and a second step P22. A layer having a relatively small area in the organic layer OR, such as the first carrier injection layer 51, the first carrier transport layer 52, the emitting layer 54, the second carrier transport layer 56, and the second carrier injection layer 57, is formed by the first step P21. A layer having a relatively large area in the organic layer OR, such as the first carrier blocking layer 53 and the second carrier blocking layer 55, is formed by the second step P22.

In the first step P21, masks MSK1 each having an opening corresponding to each organic layer OR are used. In the second step P22, masks MSK2 each having an opening larger than the opening of the masks MSK1 is used. In FIG. 9, vapor deposition sources are omitted.

Due to a difference in size of the openings of the masks MSK1 and MSK2, molecules from the vapor deposition sources reach a wider area of the substrate SUB in the second step P22 than in the first step P21. As a result, an area difference ΔS is generated between the layers formed in the first step P11 and the second step P12, respectively.

According to the forming methods described with reference to FIGS. 7 and 9, it is possible to form a layer having an area difference ΔS. Further, for example, in the forming method of FIG. 7, three or more layers having an area difference from each other can be formed by going through three or more steps having different parameters related to vapor deposition. Similarly, in the forming method of FIG. 9, even when three or more steps using masks having different opening sizes are performed, three or more layers having an area difference from each other can be formed. By appropriately using such a method, it is possible to form the organic layer OR illustrated in FIGS. 5 and 6.

Subsequently, an example of the effect exerted by this embodiment will be described.

Figure 10:
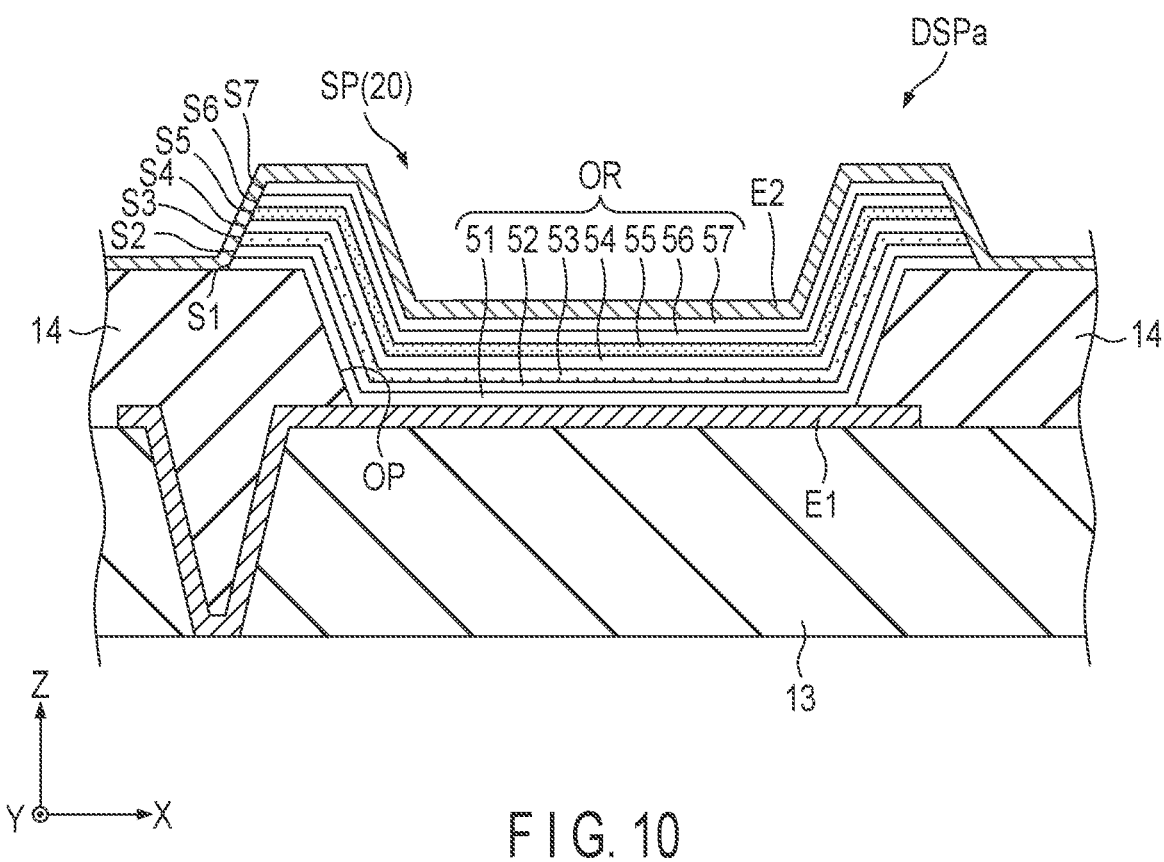
FIG. 10 is a schematic cross-sectional view illustrating a configuration of a display device according to a comparative example.

FIG. 10 is a schematic cross-sectional view illustrating a configuration of a display device DSPa according to a comparative example. This cross section corresponds to a cross section of a sub-pixel SP (display element 20) similar to that in FIG. 6. In FIG. 10, elements that are the same as or similar to the elements illustrated in FIG. 6 are designated by the same reference numerals.

In the display device DSPa, the smaller the layers 51 to 57 constituting an organic layer OR are located above. As a result, each of edge portions S1 to S7 is in contact with a second electrode E2. Therefore, unlike an original current path that passes through each layer 51 to 57 in order between the first electrode E1 and the second electrode E2, a leak path where the first electrode E1 reaches the second electrode E2 through a part of each layer 51 to 57, can be formed. The leak path causes an increase in energy consumption due to an off-leak current or an electric leakage, and degradation in the drive performance of a display element 20.

In particular, when each layer 51 to 57 of the organic layer OR is formed by using a single mask, the material of each layer is also deposited on the edge of the opening of the mask, so that an area formed becomes smaller as the layer is formed later. Therefore, as shown in FIG. 10, a structure in which each of the edge portions S1 to S7 is in contact with the second electrode E2 is likely to be formed.

Figure 11:
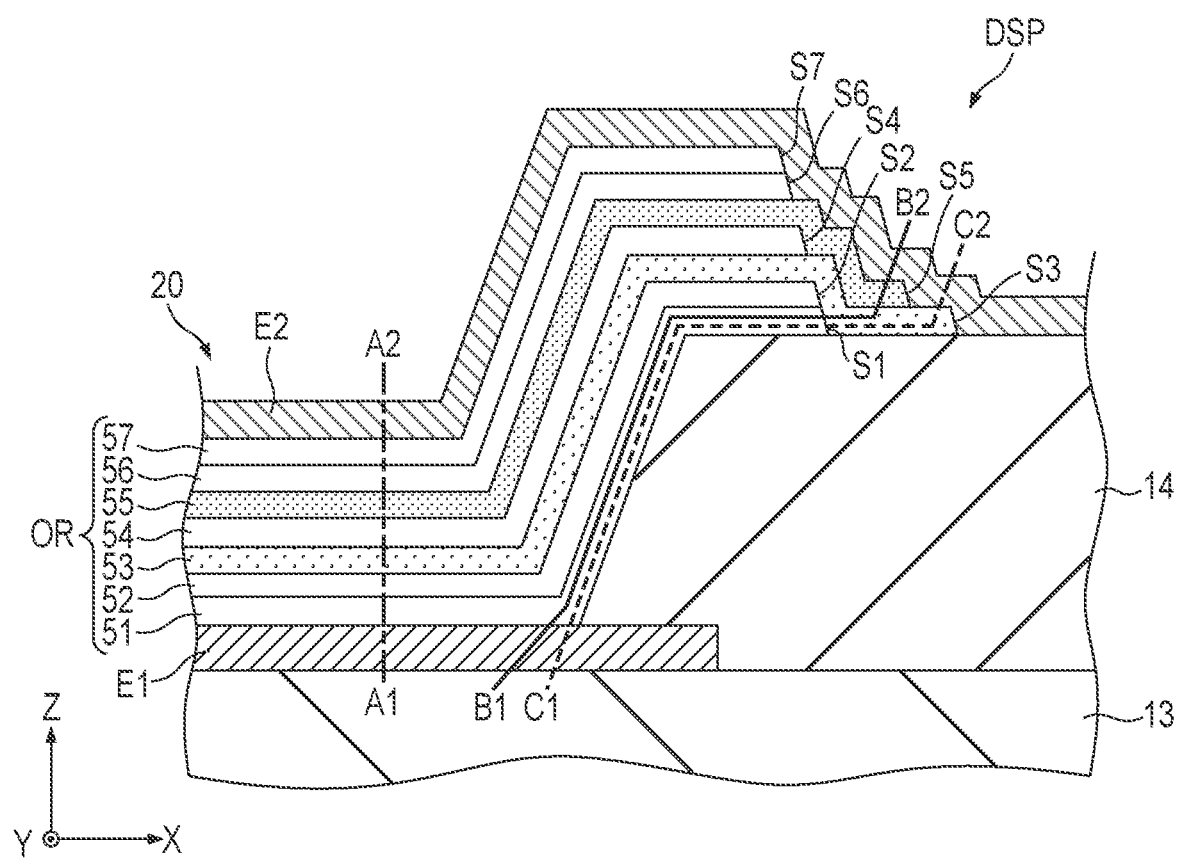
FIG. 11 is an enlarged schematic cross-sectional view of a vicinity of an edge portion of the organic layer according to the first embodiment.

FIG. 11 is a schematic cross-sectional view of the display device DSP according to the present embodiment in which a vicinity of an edge portion of the organic layer OR is enlarged. As described above, in the present embodiment, the edge portion S1 of the first carrier injection layer 51 and the edge portion S2 of the first carrier transport layer 52 are covered with the first carrier blocking layer 53. Further, the edge portion S4 of the emitting layer 54 is covered with the second carrier blocking layer 55.

Here, attention is paid to a first path A1-A2, a second path B1-B2, and a third path C1-C2 in FIG. 11. The first path A1-A2 passes through the first electrode E1, each layer 51 to 57 and the second electrode E2. The second path B1-B2 passes through the first electrode E1, the first carrier injection layer 51, the first carrier blocking layer 53, the second carrier blocking layer 55, and the second electrode E2. The third path C1-C2 passes through the first electrode E1, the first carrier injection layer 51, the first carrier blocking layer 53, and the second electrode E2.

Figure 12:
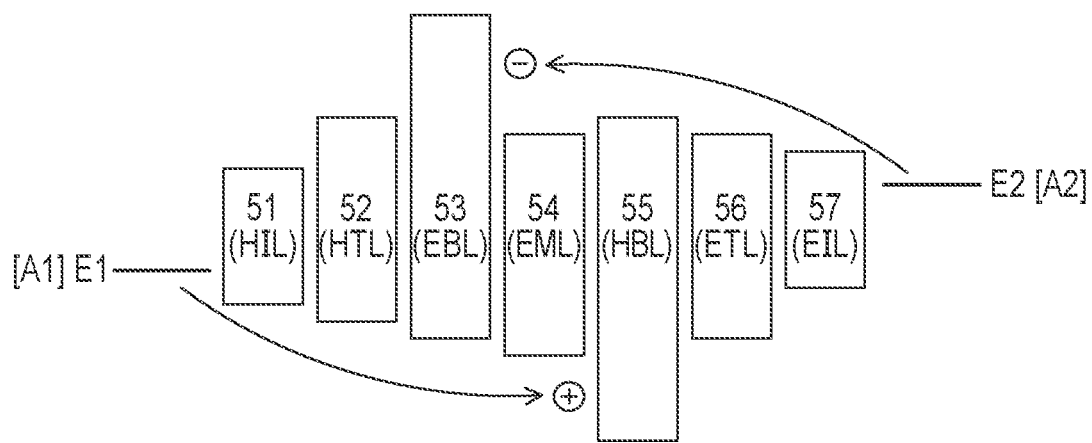
FIG. 12 is a diagram illustrating energy levels of each layer in a first path A1-A2 illustrated in FIG. 11.
Figure 13:
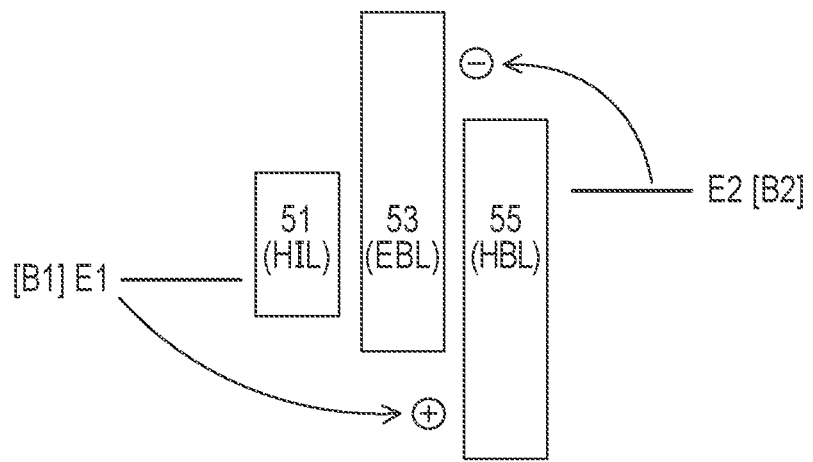
FIG. 13 is a diagram illustrating energy levels of each layer in a second path B1-B2 illustrated in FIG. 11.
Figure 14:
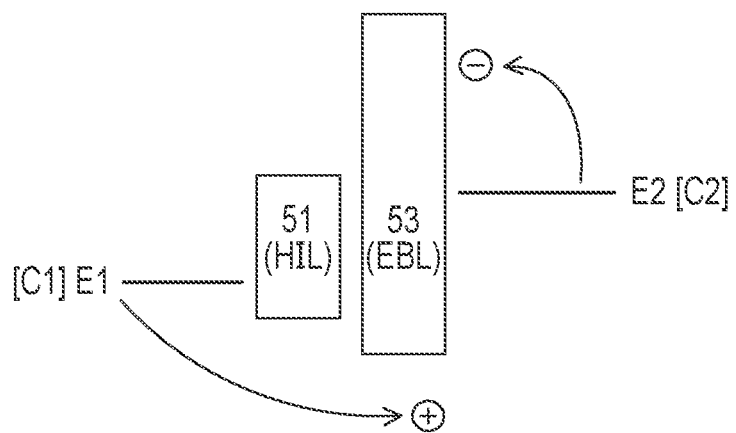
FIG. 14 is a diagram illustrating energy levels of each layer in a third path C1-C2 illustrated in FIG. 11.

FIG. 12 is a diagram illustrating energy levels of each layer in the first path A1-A2. FIG. 13 is a diagram illustrating energy levels of each layer in the second path B1-B2. FIG. 14 is a diagram illustrating the energy levels of each layer in the third path C1-C2.

As shown in FIG. 12, in the first path A1-A2, electrons are shielded by the first carrier blocking layer 53 and holes are shielded by the second carrier blocking layer 55. Similarly, in the second path B1-B2 illustrated in FIG. 13, electrons are shielded by the first carrier blocking layer 53 and holes are shielded by the second carrier blocking layer 55. Therefore, a leakage current is suppressed in the second path B1-B2.

On the other hand, in the third path C1-C2 illustrated in FIG. 14, electrons are shielded by the first carrier blocking layer 53, but holes can flow to the second electrode E2. Even in this case, the leakage current is suppressed at least by shielding the electrons. Further, in the third path C1-C2, the absence of the first carrier transport layer 52 acts as an energy barrier.

Not limited to the first path A1-A2, the second path B1-B2, and the third path C1-C2, in this embodiment, there is at least one of the first carrier blocking layer 53 with the lowest unoccupied molecular orbital (LUMO) and the second carrier blocking layer 55 with the deep highest occupied molecular orbital (HOMO) in any of the paths passing through the first electrode E1, the organic layer OR, and the second electrode E2. This enables effective leak countermeasures.

In addition to the above, various suitable effects can be obtained from the present embodiment.

Hereinafter, a second to tenth embodiments will be disclosed as other examples applicable to the display device DSP. The same configuration as in the first embodiment can be applied to the configurations not mentioned in each embodiment. Elements that are the same as or similar to the elements disclosed in the first embodiment are designated by the same reference numerals, and the description thereof may be omitted.

Second Embodiment

Figure 15:
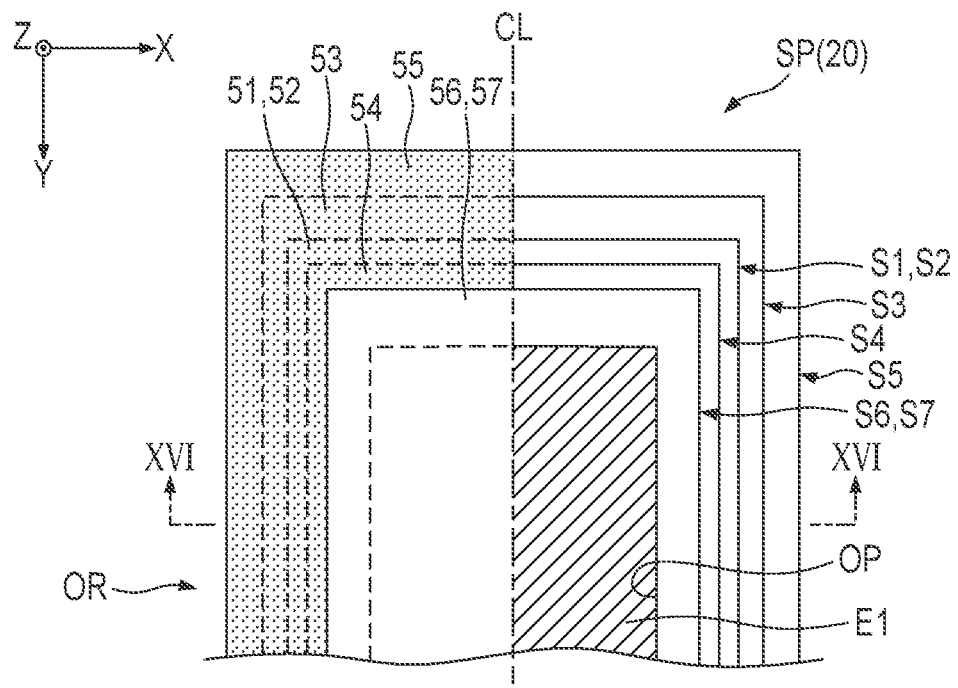
FIG. 15 is a schematic plan view of an organic layer according to a second embodiment.
Figure 16:
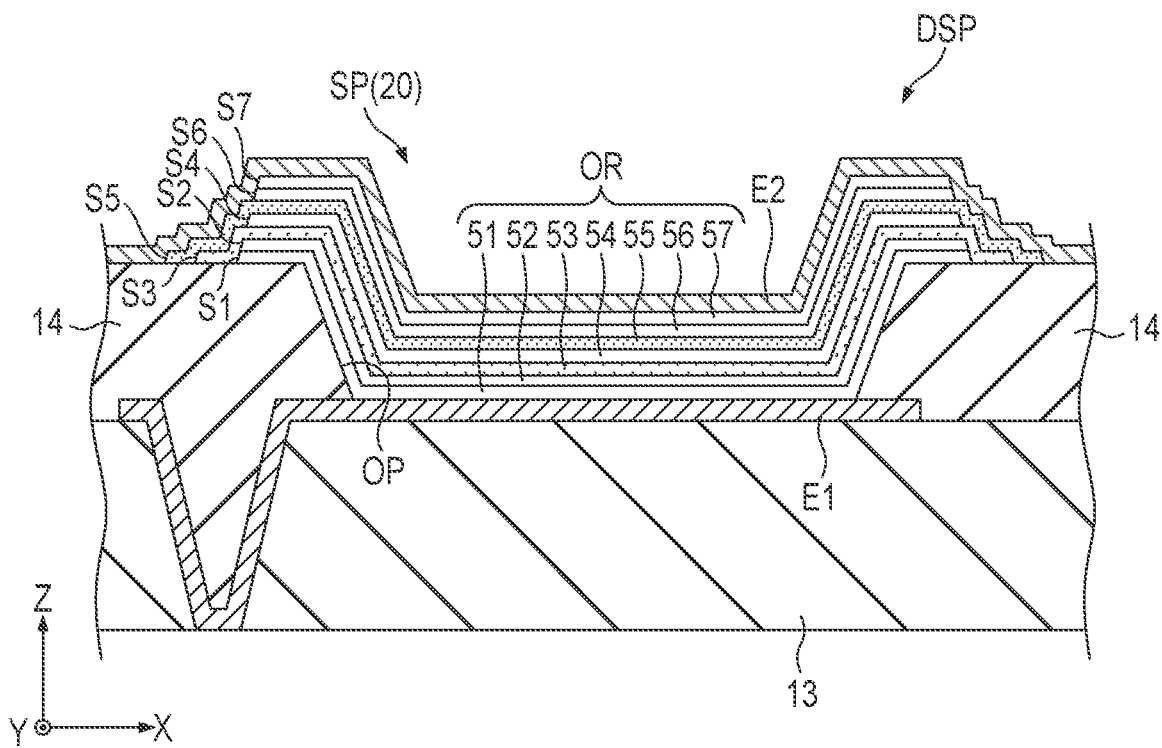
FIG. 16 is a schematic cross-sectional view of the display device along XVI-XVI line in FIG. 15.

FIG. 15 is a schematic plan view of an organic layer OR according to a second embodiment. FIG. 16 is a schematic cross-sectional view of a display device DSP along line XVI-XVI in FIG. 15. In FIG. 15, similarly to FIG. 5, the shape in which the organic layer OR is viewed in planar view is illustrated in a region on a left side of a center line CL in a first direction X of a sub-pixel SP (display element 20), and the outer shapes of each layer 51 to 57 of the organic layer OR and an opening OP are illustrated in a region on a right side of the center line CL.

The organic layer OR illustrated in FIG. 15 differs from the organic layer OR illustrated in FIG. 5 in that the area of a second carrier blocking layer 55 is larger than the area of a first carrier blocking layer 53. In planar view, edge portions S1 and S2 are located between edge portions S3 and S4, the edge portion S3 is located between the edge portions S1, S2 and an edge portion S5, and the edge portion S4 is located between the edge portions S1, S2 and edge portions S6, S7, and the edge portions S6, S7 are located between the edge portion S4 and the opening OP. The edge portion S5 corresponds to the outermost circumference of the organic layer OR.

As shown in FIG. 16, the second carrier blocking layer 55 is mostly located above an emitting layer 54, and a portion near the edge portion S5 is in contact with the first carrier blocking layer 53 and a rib 14. That is, the second carrier blocking layer 55 covers the edge portion S4 of the emitting layer 54 and the edge portion S3 of the first carrier blocking layer 53. The edge portions S1 to S4 are not in contact with a second electrode E2. The edge portion S5 of the second carrier blocking layer 55 and a portion in the vicinity thereof are in contact with the second electrode E2. Although the cross section in an X-Z plane is illustrated in FIG. 16, a cross section in a Y-Z plane has a similar structure. In forming the organic layer OR, for example, the forming method disclosed in the first embodiment can be appropriately used.

In the configuration of the present embodiment, a path between a first electrode E1 and the second electrode E2 passes through the first carrier blocking layer 53 and the second carrier blocking layer 55 at any position of the organic layer OR. Therefore, a leakage current can be suppressed more effectively.

Third Embodiment

Figure 17:
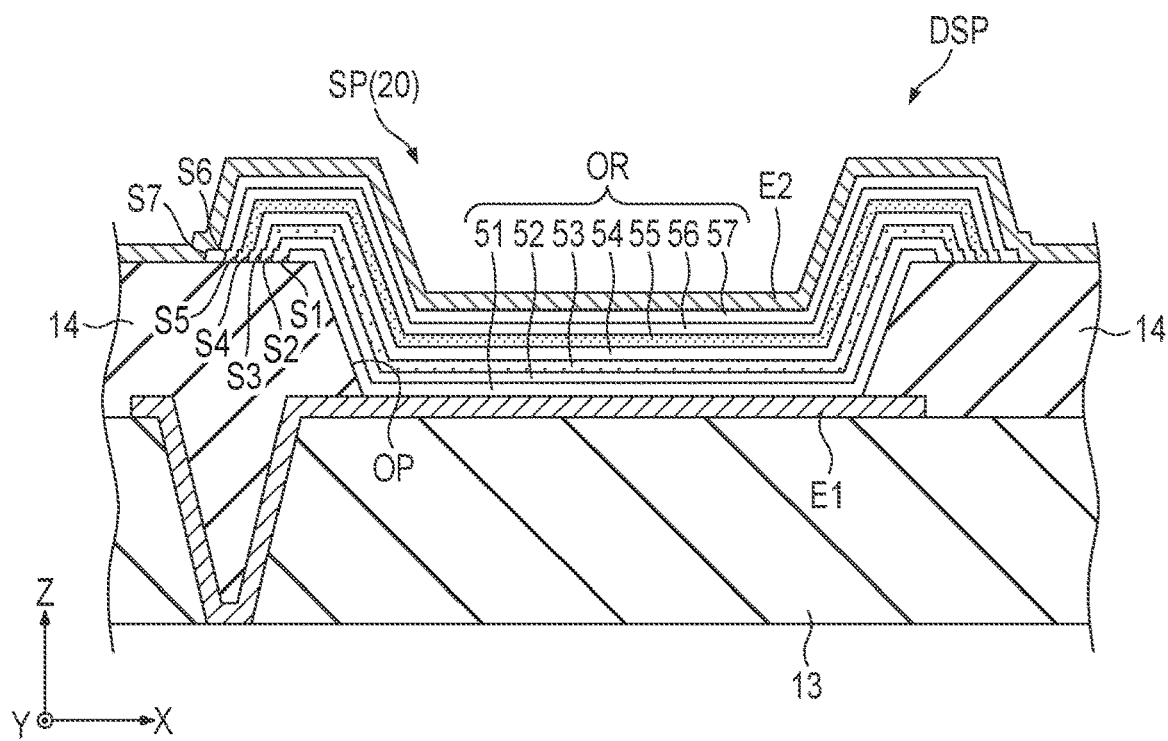
FIG. 17 is a schematic cross-sectional view of a display device according to a third embodiment.

FIG. 17 is a schematic cross-sectional view of a display device DSP according to a third embodiment. In the example of FIG. 17, a first carrier transport layer 52 covers an edge portion S1 of a first carrier injection layer 51, a first carrier blocking layer 53 covers an edge portion S2 of the first carrier transport layer 52, and an emitting layer 54 covers an edge portion S3 of the first carrier blocking layer 53, a second carrier blocking layer 55 covers an edge portion S4 of the emitting layer 54, a second carrier transport layer 56 covers an edge portion S5 of the second carrier blocking layer 55, and a second carrier injection layer 57 covers an edge portion S6 of the second carrier transport layer 56. In each layer 51 to 57, a portion near the edge portions S1 to S7 is in contact with a rib 14. The second carrier injection layer 57 is in contact with a second electrode E2 as a whole, but the other layers 51 to 56 are not in contact with the second electrode E2.

Although the cross section in an X-Z plane is illustrated in FIG. 17, a cross section in a Y-Z plane has a similar structure. That is, the area of each layer 51 to 57 is larger as the layer is closer to the second electrode E2. In forming the organic layer OR, for example, the forming method disclosed in the first embodiment can be appropriately used.

In the configuration of the present embodiment, the second carrier injection layer 57 is in contact with the second electrode E2, and the other layers 51 to 56 are out of contact with the second electrode E2. Further, the path between the first electrode E1 and the second electrode E2 passes through all the layers 51 to 57 at any position of the organic layer OR. Thereby, a leakage current can be suppressed more effectively.

The second carrier injection layer 57 is located at the top of the organic layer OR. Therefore, when the second carrier injection layer 57 is expanded as in the present embodiment, it is possible to cover all the edge portions S1 to S6 of the other layers 51 to 56.

The edge portions S1 to S6 may have the same positional relationship as in FIG. 6 or FIG. 16. Even in this case, since at least the second carrier injection layer 57 is interposed between these edge portions S1 to S6 and the second electrode E2, the effect of suppressing the leak current can be expected.

Fourth Embodiment

Figure 18:
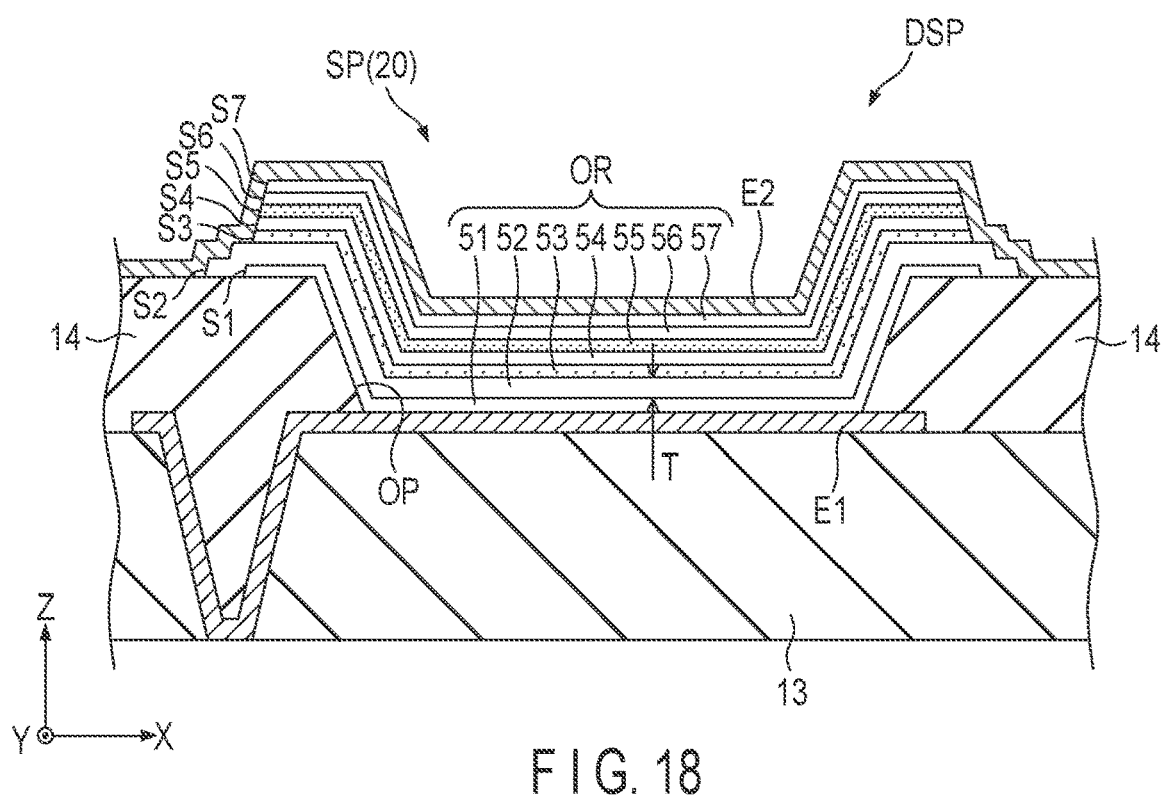
FIG. 18 is a schematic cross-sectional view of a display device according to a fourth embodiment.

FIG. 18 is a schematic cross-sectional view of a display device DSP according to a fourth embodiment. In the example of FIG. 18, a first carrier transport layer 52 covers an edge portion S1 of a first carrier injection layer 51. As a result, the first carrier injection layer 51 is not in contact with a second electrode E2.

On the other hand, an edge portion S2 of the first carrier transport layer 52, an edge portion S3 of a first carrier blocking layer 53, an edge portion S4 of an emitting layer 54, an edge portion S5 of a second carrier blocking layer 55 and an edge portion S6 of a second carrier transport layer 56 are in contact with the second electrode E2.

Although the cross section in an X-Z plane is illustrated in FIG. 18, a cross section in a Y-Z plane has a similar structure. That is, the area of the first carrier transport layer 52 is larger than the area of the other layers 51 to 57. In forming the organic layer OR, for example, the forming method disclosed in the first embodiment can be appropriately used.

In the present embodiment, a first electrode E1 is a reflecting electrode that reflects light emitted by the emitting layer 54. Further, the first carrier transport layer 52 also has a role as an optical adjustment layer. Specifically, in order to adjust a relationship between the wavelength of light emitted upward by the emitting layer 54 and the wavelength of light reflected upward by the first electrode E1, the first carrier transport layer 52 is provided with a thickness T greater than that of the other layers 51, and 53 to 57.

With such a configuration, a path between the first electrode E1 and the second electrode E2 passes through the first carrier transport layer 52 which is thick at any position of the organic layer OR. Thereby, a leakage current can be effectively suppressed.

Fifth Embodiment

Figure 19:
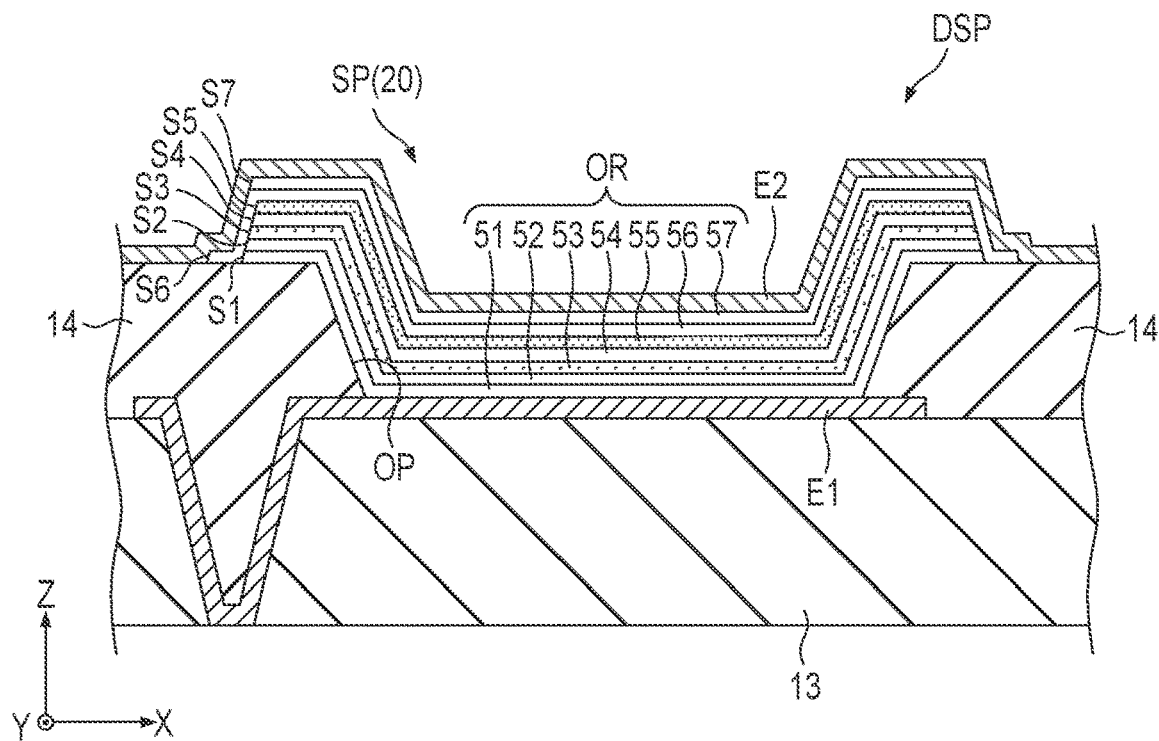
FIG. 19 is a schematic cross-sectional view of a display device according to a fifth embodiment.

FIG. 19 is a schematic cross-sectional view of a display device DSP according to a fifth embodiment. In the example of FIG. 19, a second carrier transport layer 56 covers an edge portion S1 of a first carrier injection layer 51, an edge portion S2 of a first carrier transport layer 52, an edge portion S3 of a first carrier blocking layer 53, an edge portion S4 of an emitting layer 54, and an edge portion S5 of a second carrier blocking layer 55. The edge portion S6 of the second carrier transport layer 56 is not covered by the second carrier injection layer 57. In the second carrier transport layer 56, the edge portion S6 and a portion in the vicinity thereof are in contact with a rib 14 and a second electrode E2. Each layer 51 to 55 below the second carrier transport layer 56 is not in contact with the second electrode E2.

Although the cross section in an X-Z plane is illustrated in FIG. 19, a cross section in a Y-Z plane has a similar structure. That is, the area of the second carrier transport layer 56 is larger than the area of the other layers 51 to 55, and 57. In forming the organic layer OR, for example, the forming method disclosed in the first embodiment can be appropriately used.

As the second carrier injection layer 57, a thin film of a metal compound is generally used. Therefore, when the second carrier injection layer 57 located at the uppermost position in the organic layer OR is expanded, the edge portions S1 to S6 of the other layers 51 to 56 may not be covered well. On the other hand, the second carrier transport layer 56 is formed thicker than the second carrier injection layer 57 by an inorganic material or an organic material. Therefore, the second carrier transport layer 56 is suitable for covering the edge portions S1 to S5.

Sixth Embodiment

In the first to fifth embodiments, it is assumed that the edge portions S1 to S7 of each layer 51 to 57 have the same relationship over the entire outer circumference of the organic layer OR. However, the relationship between the edge portions S1 to S7 in a part of the outer shape of the organic layer OR and the relationship between the edge portions S1 to S7 in the other part may be different.

Figure 20:
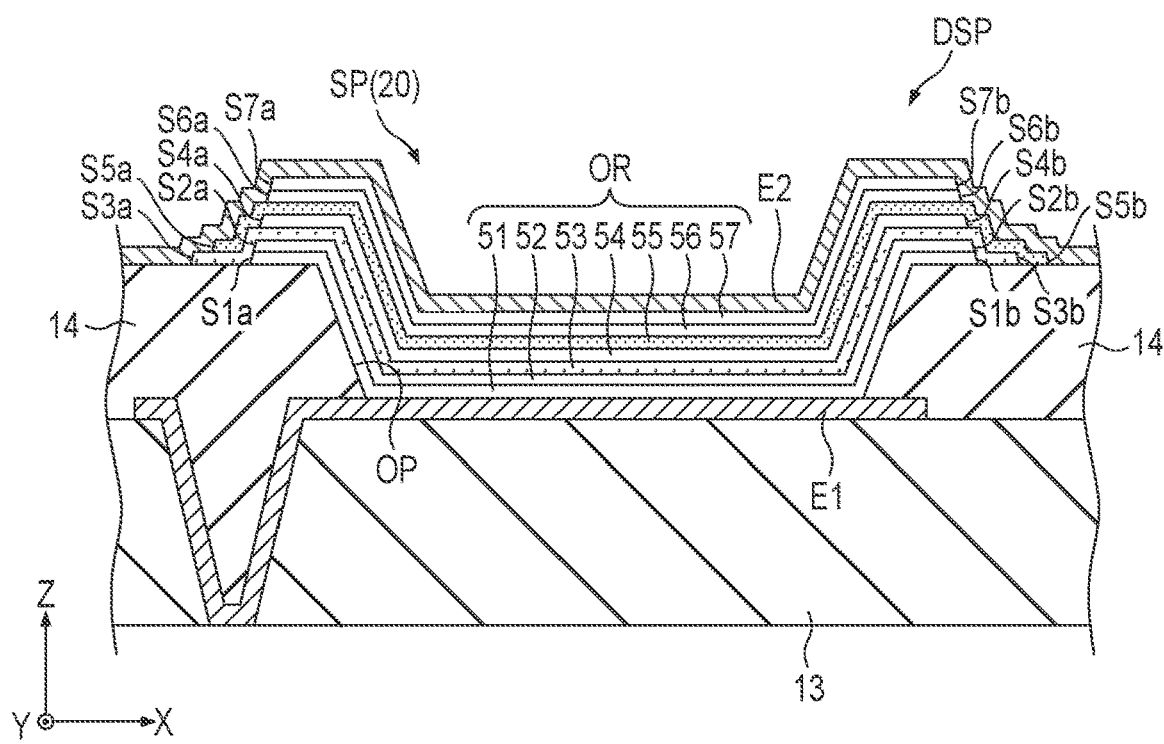
FIG. 20 is a schematic cross-sectional view of a display device according to a sixth embodiment.

FIG. 20 is a schematic cross-sectional view of a display device DSP according to a sixth embodiment, and illustrates an example of a configuration in which the relationship between edge portions S1 to S7 is partially different in the outer shape of an organic layer OR. The edge portion S1 has a first side S1a and a second side S1b. The edge portion S2 has a first side S2a and a second side S2b. The edge portion S3 has a first side S3a and a second side S1b. The edge portion S4 has a first side S4a and a second side S4b. The edge portion S5 has a first side S5a and a second side S5b. The edge portion S6 has a first side S6a and a second side S6b. The edge portion S7 has a first side S7a and a second side S7b. All of these sides are parallel to the second direction Y.

In the example of FIG. 20, the first sides S1a to S7a have the same relationship as that of the edge portions S1 to S7 illustrated in FIG. 6, and the second sides S1b to S7b have the same relationship as that of the edge portions S1 to S7 illustrated in FIG. 16. The first side S3a is not covered with a second carrier blocking layer 55. The second side S3b is covered with the second carrier blocking layer 55. Not limited to this example, the relationships illustrated in each embodiment can be selectively applied to the first sides S1a to S7a and the second sides S1b to S7b.

Although the cross section in an X-Z plane is illustrated in FIG. 20, the same structure can be applied to a cross section in a Y-Z plane. That is, the relationships illustrated in each embodiment may be selectively applied to each of the pair of sides parallel to the first direction X among the edge portions S1 to S7.

Seventh Embodiment

The first to sixth embodiments illustrates examples of a configuration in which among the layers 51 to 57 constituting the organic layer OR, a layer other than the first carrier injection layer 51 located at the bottom is expanded to cover the edge portion of a layer below the expanded layer. In the present embodiment, a configuration of an organic layer OR and a method for forming the organic layer OR are exemplified from a viewpoint of suppressing a contact between a specific layer and a second electrode E2 by reducing the specific layer.

Figure 21:
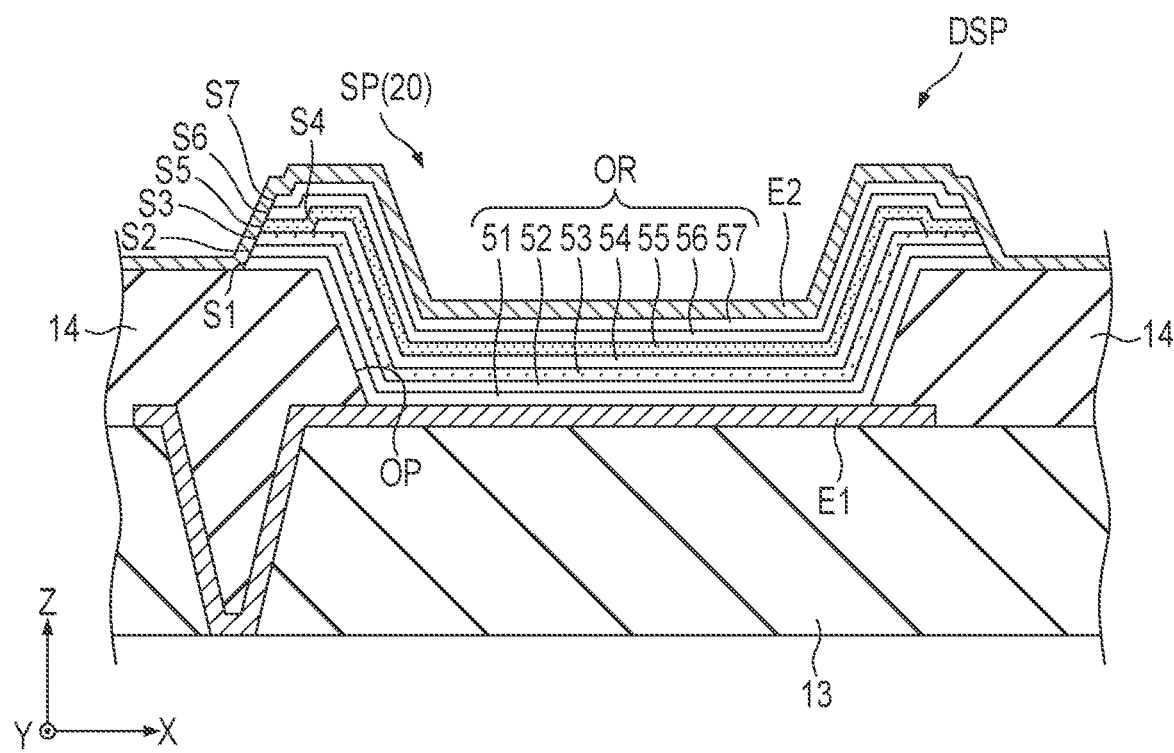
FIG. 21 is a schematic cross-sectional view of a display device according to a seventh embodiment.

FIG. 21 is a schematic cross-sectional view of a display device DSP according to a seventh embodiment. In the example of FIG. 21, an emitting layer 54 is smaller than other layers 51 to 53, and 55 to 57. An edge portion S4 of the emitting layer 54 is covered with a second carrier blocking layer 55 and is not in contact with a second electrode E2. Edge portions S1 to S3 and S5 to S7 of the other layers 51 to 53, and 55 to 57 are in contact with the second electrode E2.

Figure 22:
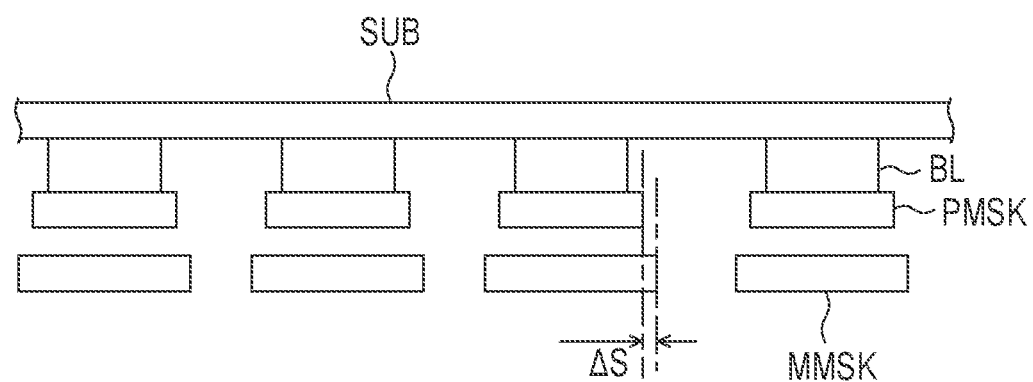
FIG. 22 is a diagram schematically illustrating an example of the method for forming an organic layer according to the seventh embodiment.

FIG. 22 is a diagram schematically illustrating an example of the method for forming the organic layer OR. In this forming method, each layer 51 to 57 is formed by using polymer masks PMSK and metal masks MMSK on a substrate SUB in which a lower layer portion below the organic layer OR is formed in the display device DSP. Each polymer mask PMSK is opposed on a base layer BL formed on the substrate SUB and has an opening corresponding to the organic layer OR. Each metal mask MMSK has an opening smaller than that of the polymer mask PMSK, and there is an area difference ΔS between the openings of both masks.

A first carrier injection layer 51, a first carrier transport layer 52, and a first carrier blocking layer 53 below an emitting layer 54 are formed through the opening of the polymer mask PMSK by vapor deposition in a state where the metal mask MMSK is not opposed. Subsequently, the metal mask MMSK is opposed on top of the polymer mask PMSK. The emitting layer 54 is formed by vapor deposition through the opening of the metal mask MMSK. After that, the metal mask MMSK is removed. A second carrier blocking layer 55, a second carrier transport layer 56, and a second carrier injection layer 57 above the emitting layer 54 are formed by vapor deposition through the opening of the polymer mask PMSK. By forming each of the layers 51 to 57 in this way, the emitting layer 54 can be made smaller than the other layers 51 to 53, and 55 to 57.

The organic layer OR illustrated in FIG. 21 can also be formed by the method illustrated in FIG. 7. That is, the emitting layer 54 may be formed by the first step P11, and the other layers 51 to 53, 55 to 57 may be formed by the second step P12.

The organic layer OR illustrated in FIG. 21 can also be formed by the method illustrated in FIG. 9. That is, the emitting layer 54 may be formed by the first step P21, and the other layers 51 to 53, and 55 to 57 may be formed by the second step P22.

Eighth Embodiment

In the first embodiment, it is assumed that each sub-pixel SP has a rectangular organic layer OR as illustrated in FIG. 5. In this embodiment, another example of an organic layer OR disposed in a display region DA is disclosed.

Figure 23:
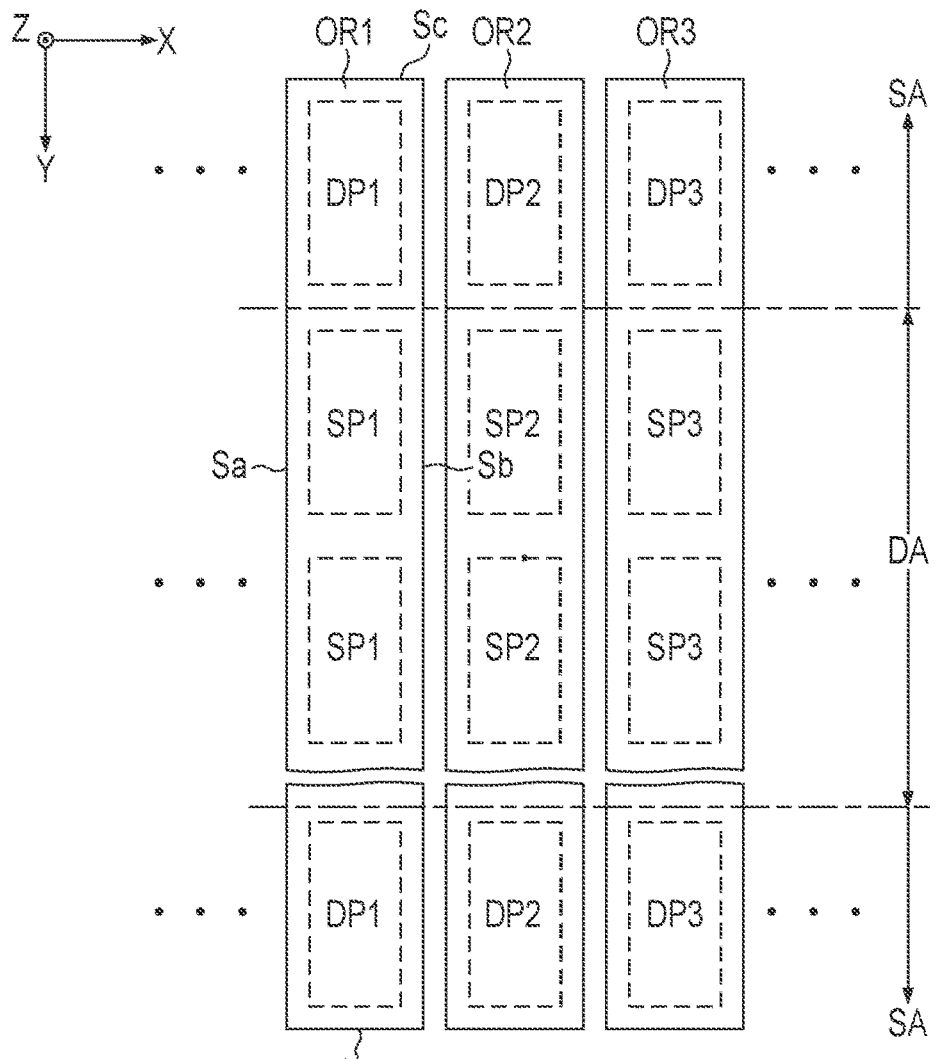
FIG. 23 is a diagram illustrating an example of sub-pixels and organic layers according to an eighth embodiment.

FIG. 23 is a diagram illustrating an example of sub-pixels SP and an organic layer OR according to the present embodiment. Similar to the example of FIG. 2, in the display region, a plurality of sub-pixels SP1 are arranged in the second direction Y, a plurality of sub-pixels SP2 are arranged in the second direction Y, and a plurality of sub-pixels SP3 are arranged in the second direction Y.

Further, dummy sub-pixels DP1, DP2, and DP3 are disposed in a peripheral region SA. The dummy sub-pixels DP1, DP2, and DP3 are arranged in the second direction Y with the sub-pixels SP1, SP2, and SP3 disposed at the end of the display region DA in the second direction Y, respectively. The dummy sub-pixels DP1, DP2, and DP3 are pixels that do not contribute to image display. For example, the dummy sub-pixels DP1, DP2, and DP3 include a first electrode E1 and do not include a pixel circuit 1. Alternatively, the dummy sub-pixels DP1, DP2, and DP3 include the first electrode E1 and the pixel circuit 1, but the first electrode E1 and the pixel circuit 1 are not connected to each other.

In the example of FIG. 23, the organic layer OR is continuously disposed over the plurality of sub-pixels SP. Specifically, an organic layer OR1 that emits red light is disposed over the plurality of sub-pixels SP1 and the dummy sub-pixel DP1 that are arranged in the second direction Y, an organic layer OR2 that emits green light is disposed over the plurality of sub-pixels SP2 and the dummy sub-pixel DP2 that are arranged in the second direction Y, and an organic layer OR3 that emits blue light is disposed over the plurality of sub-pixels SP3 and the dummy sub-pixel DP3 arranged in the second direction Y. The organic layers OR1, OR2, and OR3 are arranged at intervals in the first direction X.

The organic layers OR1, OR2, and OR3 have a pair of sides Sa and Sb parallel to the second direction Y and a pair of sides Sc and Sd parallel to the first direction X. The sides Sa and Sb are located in both the display region DA and the peripheral region SA. The sides Sc and Sd are located in the peripheral region SA and not in the display region DA.

Figure 24:
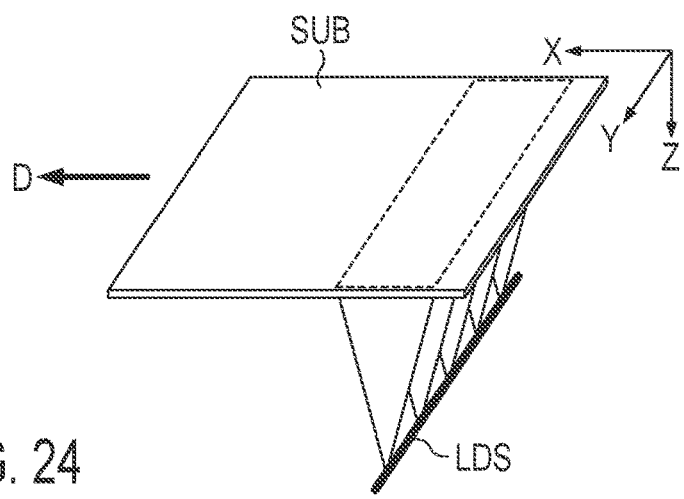
FIG. 24 is a diagram for explaining an example of the effect of the eighth embodiment.

FIG. 24 is a diagram for explaining an example of the effect of the present embodiment. FIG. 24 illustrates a process of forming an organic layer OR using a linear vapor deposition source LDS on a substrate SUB in which a lower layer portion than the organic layer OR (OR1, OR2, OR3) of the display device DSP is formed. A mask used for the vapor deposition is not illustrated.

The linear vapor deposition source LDS has a plurality of holes arranged in the second direction Y, and molecules for forming each layer 51 to 57 are emitted from these holes. The substrate SUB moves in a sweep direction D, which exposes the entire substrate SUB to the molecules emitted from the linear vapor deposition source LDS. The sweep direction D is parallel to the first direction X.

For example, when the first step P11 and the second step P12 illustrated in FIG. 7 are carried out in the manner illustrated in FIG. 24 to form an island-shaped organic layer OR similar to that in FIG. 5, a difference in the outer shape of the formed layers between the first step P11 and the second step P12 mainly appears on a side intersecting the sweep direction D, that is, a pair of sides parallel to the second direction Y. Regarding a side parallel to the sweep direction D, that is, a pair of sides parallel to the first direction X, a difference in position may not appear sufficiently.

In this regard, in the configuration illustrated in FIG. 23, the organic layer OR does not have sides Sc and Sd parallel to the first direction X in the display region DA. Regarding the sides Sa and Sb parallel to the second direction Y, for example, as illustrated in FIGS. 6, 16 and 17 to 21, shapes in which the edge portions S1 to S7 of each layer 51 to 57 have different positions can be preferably realized.

The sides Sc and Sd are located in the peripheral region SA, and dummy sub-pixels DP1, DP2 and DP3 are interposed between the sides Sc and Sd and the display region DA. As a result, even if shape defects of the layers 51 to 57 of the organic layer OR occur on the sides Sc and Sd, the influence is unlikely to affect the sub-pixels SP1, SP2, and SP3.

Ninth Embodiment

The layer structure of an organic layer OR is not limited to that illustrated in FIG. 4. In the organic layer OR, any one of each layer 51 to 57 may be omitted. Further, the organic layer OR may include layers having other functions in addition to the layers 51 to 57. Further, the organic layer OR may have a tandem structure including two emitting layers.

Figure 25:
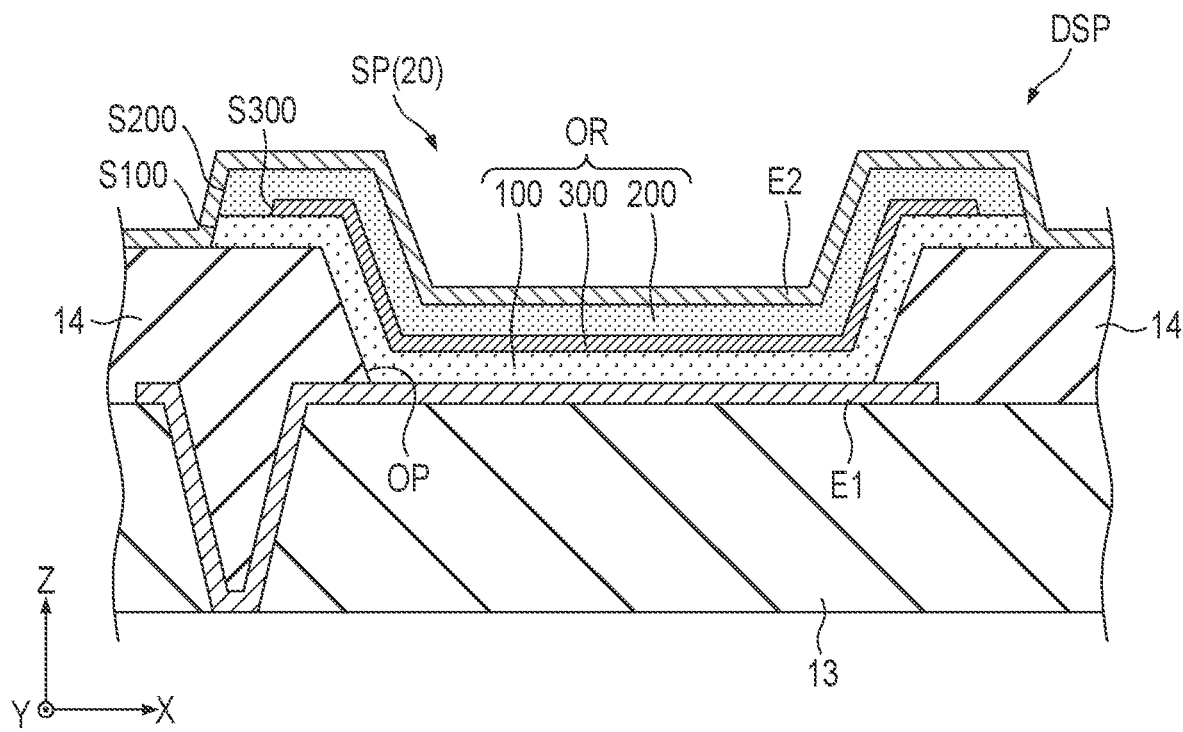
FIG. 25 is a schematic cross-sectional view of a display device according to a ninth embodiment.

FIG. 25 is a schematic cross-sectional view of a display device DSP provided with an organic layer OR having a tandem structure. The organic layer OR has a first organic layer 100 in contact with a first electrode E1, a second organic layer 200 in contact with a second electrode E2, and a middle layer 300 located between the first organic layer 100 and the second organic layer 200.

An edge portion S100 of the first organic layer 100, an edge portion S200 of the second organic layer 200, and an edge portion S300 of the middle layer 300 are all located on a rib 14. In the example of FIG. 25, the edge portion S300 is covered with the second organic layer 200. As a result, the middle layer 300 is not in contact with the second electrode E2.

Figure 26:
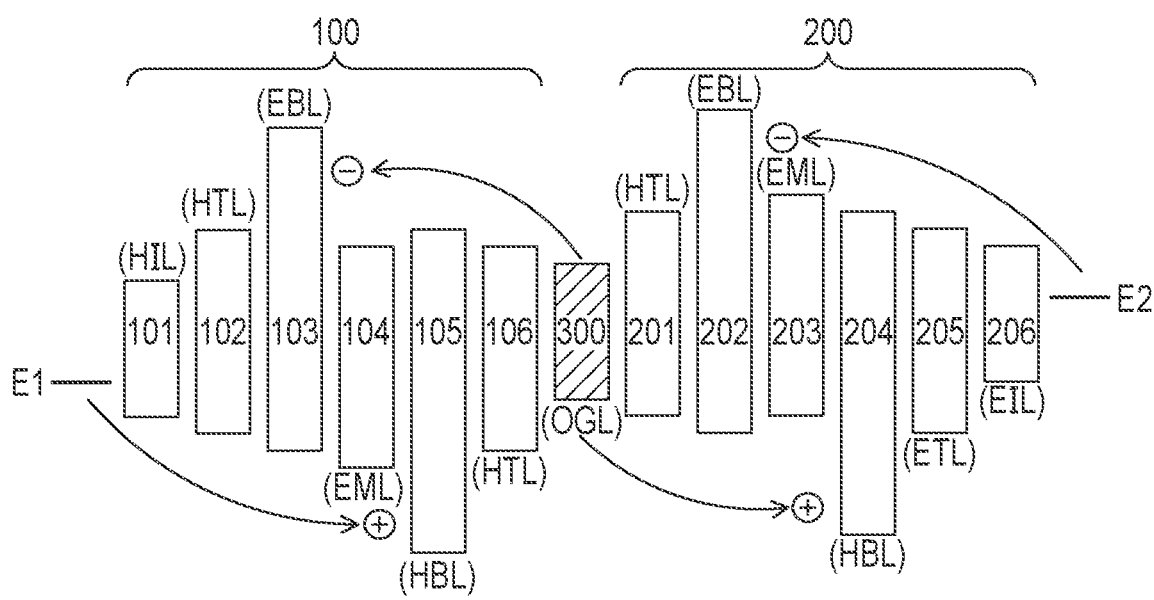
FIG. 26 is a diagram illustrating energy levels of each layer included in an organic layer according to the ninth embodiment.

FIG. 26 is a diagram illustrating energy levels of each layer included in the organic layer OR according to the present embodiment. The first organic layer 100 includes a first carrier injection layer 101, a first carrier transport layer 102, a first carrier blocking layer 103, a first emitting layer 104 (EML), a second carrier blocking layer 105, and a second carrier transport layer 106. The second organic layer 200 includes a third carrier transport layer 201, a third carrier blocking layer 202, a second emitting layer 203 (EML), a fourth carrier blocking layer 204, a fourth carrier transport layer 205, and a second carrier injection layer 206. The middle layer 300 is located between the second carrier transport layer 106 and the third carrier transport layer 201.

In this embodiment, it is assumed that the first electrode E1 is the anode and the second electrode E2 is the cathode. For example, in this case, the first carrier injection layer 101 is a hole-injection layer (HIL), the first carrier transport layer 102 and the third carrier transport layer 201 are hole-transport layers (HTL), and the first carrier blocking layer 103 and the third carrier blocking layer 202 are electron-blocking layers (EBL), the second carrier blocking layer 105 and the fourth carrier blocking layer 204 are hole-blocking layers (HBL), the second carrier transport layer 106 and the fourth carrier transport layer 205 are electron-transport layers (ETL), and the second carrier injection layer 206 is an electron-injection layer (EIL). Further, the middle layer 300 is, for example, a charge generation layer (CGL) that generates electrons and holes according to a voltage.

The middle layer 300, which is the charge generation layer, is formed of, for example, a metal material, and when it comes into contact with the second electrode E2, a leakage current is likely to occur. Further, when a leak current is generated via the middle layer 300, only one of the first emitting layer 104 and the second emitting layer 203 can emit light. Therefore, as illustrated in FIG. 25, it is preferable that the edge portion S300 of the middle layer 300 is covered with any of the layers constituting the second organic layer 200.

The layer covering the edge portion S300 is, for example, one, multiple or all of the third carrier transport layer 201, the third carrier blocking layer 202, the fourth carrier blocking layer 204, the fourth carrier transport layer 205, and the second carrier injection layer 206. Further, the same configuration as the organic layer OR exemplified in each of the above-described embodiments may be applied to either or both of the first organic layer 100 and the second organic layer 200.

The organic layer OR may include three or more organic layers including an emitting layer, and a middle layer interposed between the organic layers. Also in this case, the same effect as that of the present embodiment can be obtained by covering the edge portion of each middle layer with the upper layer.

Tenth Embodiment

Figure 27:
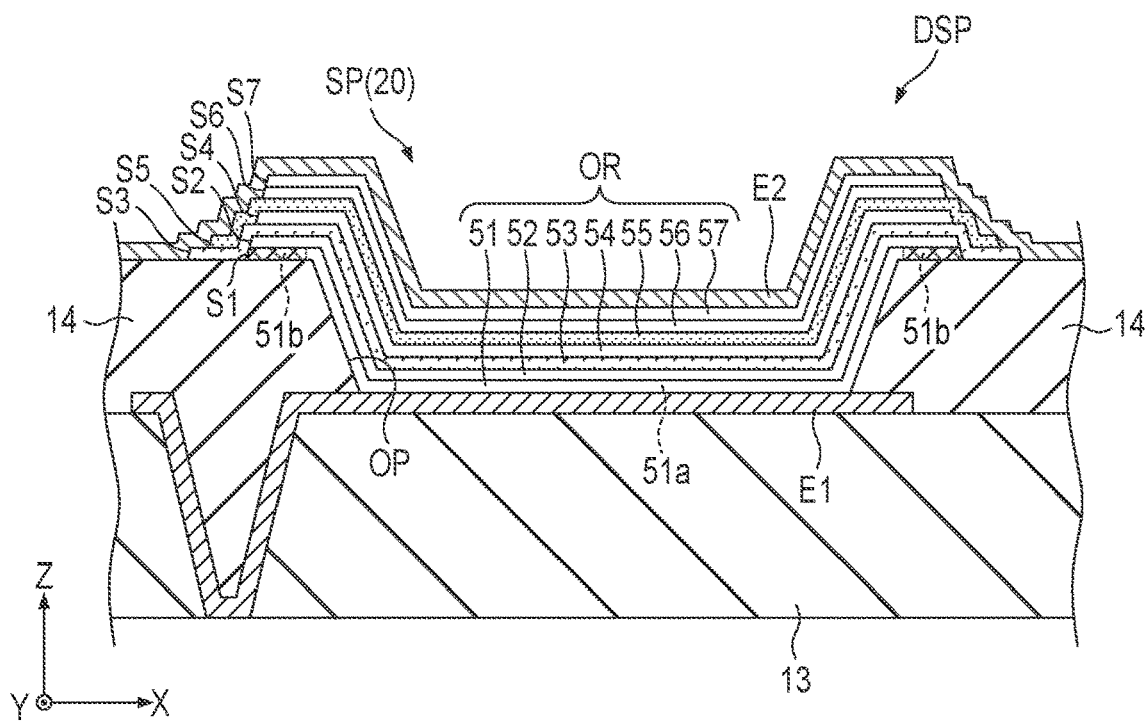
FIG. 27 is a schematic cross-sectional view of a display device according to a tenth embodiment.

FIG. 27 is a schematic cross-sectional view of a display device DSP according to a tenth embodiment. In the example of FIG. 27, each of layers 51 to 57 constituting an organic layer OR has the same shape as the example of FIG. 6.

A first carrier injection layer 51 has a first region 51a and a second region 51b located between the first region 51a and an edge portion S1. In the first region 51a, a dopant (for example, a p-type dopant) is distributed at a first concentration with respect to a host (main material). In the second region 51b, a dopant is distributed to the host at a second concentration lower than the first concentration. The first region 51a overlaps an opening OP and is in contact with a first electrode E1. The second region 51b is located above the rib 14.

Figure 28:
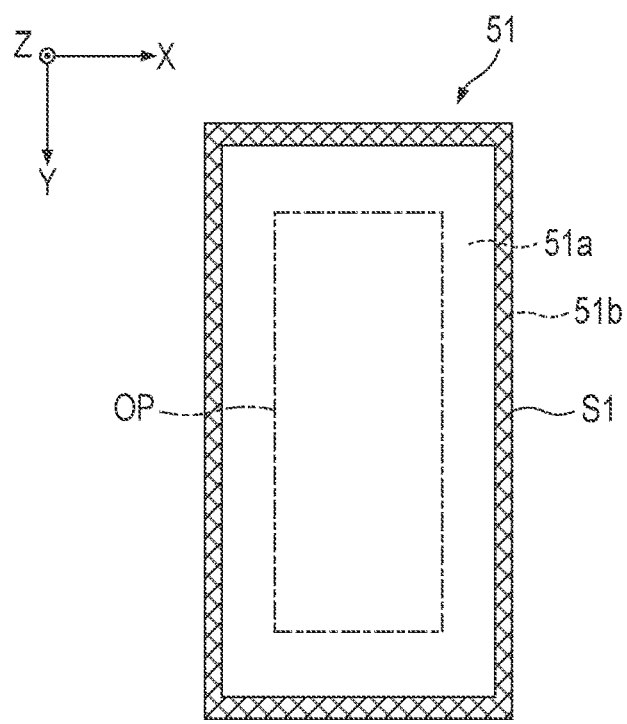
FIG. 28 is a schematic plan view of a first carrier injection layer according to the tenth embodiment.

FIG. 28 is a schematic plan view of the first carrier injection layer 51. Here, it is assumed that the first carrier injection layer 51 is rectangle as in the example of FIG. 5. In the example of FIG. 28, the first region 51a is, for example, a rectangle that overlaps the entire opening OP. The second region 51b has a frame shape surrounding the first region 51a.

Figure 29:
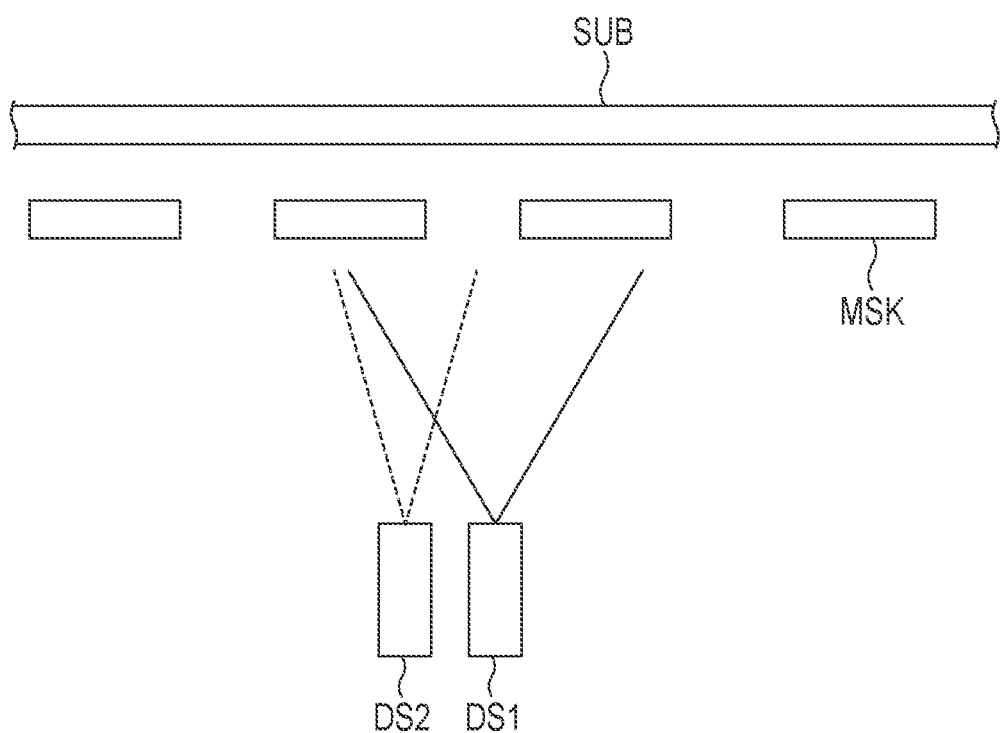
FIG. 29 is a diagram illustrating an example of a method for forming the first carrier injection layer according to the tenth embodiment.

FIG. 29 is a diagram illustrating an example of a method for forming the first carrier injection layer 51. A mask MSK having an opening corresponding to the organic layer OR is opposed on a substrate SUB in which a lower layer portion of the display device DSP is formed below the organic layer OR.

The host of the first carrier injection layer 51 is formed by a vapor deposition source DS1. The host is doped with a dopant by a vapor deposition source DS2. Similar to the first step P11 and the second step P12 illustrated in FIG. 7, a range in which molecules from the vapor deposition source DS2 reach the substrate SUB through the opening of the mask MSK is larger than a range in which molecules from the vapor deposition source DS1 reach the substrate SUB through the opening. This makes it possible to form a first carrier injection layer 51 having a first region 51a and a second region 51b around it.

Since the concentration of the dopant in the second region 51b is lower than the concentration of the dopant in the first region 51a, the second region 51b has a higher resistance than that of the first region 51a. Therefore, in the configuration of the present embodiment, a leakage current in a path from the first carrier injection layer 51 through the edge portion S1 and a portion in the vicinity thereof to the second electrode E2 is suppressed.

Generally, the dopant material is active, and there is a concern that it may be deteriorated by the atmosphere. Such deterioration is likely to occur in the vicinity of the edge portion S1. With the configuration of the present embodiment, since the concentration of the dopant in the second region 51b is low, such deterioration can be suppressed.

In this embodiment, in a case where each layer 51 to 57 has the same shape as the example of FIG. 6, an example of forming a first region 51a and a second region 51b in the first carrier injection layer 51 is illustrated. The first region and the second region do not necessarily have to be formed in the first carrier injection layer 51, and may be formed in any of the other layers 52 to 57. Further, the first region and the second region may be formed in two or more layers out of the layers 51 to 57. Further, the first region and the second region may be provided for the organic layer OR having the shape illustrated in FIG. 10, FIGS. 16 to 21, or FIG. 25.

Each layer 51 to 57 may be provided with not only two regions of a first region and a second region, but also more regions having different dopant concentrations. In this case, for example, the concentration of the dopant may be lowered in a region closer to an edge portion of the layer.

Figure 30:
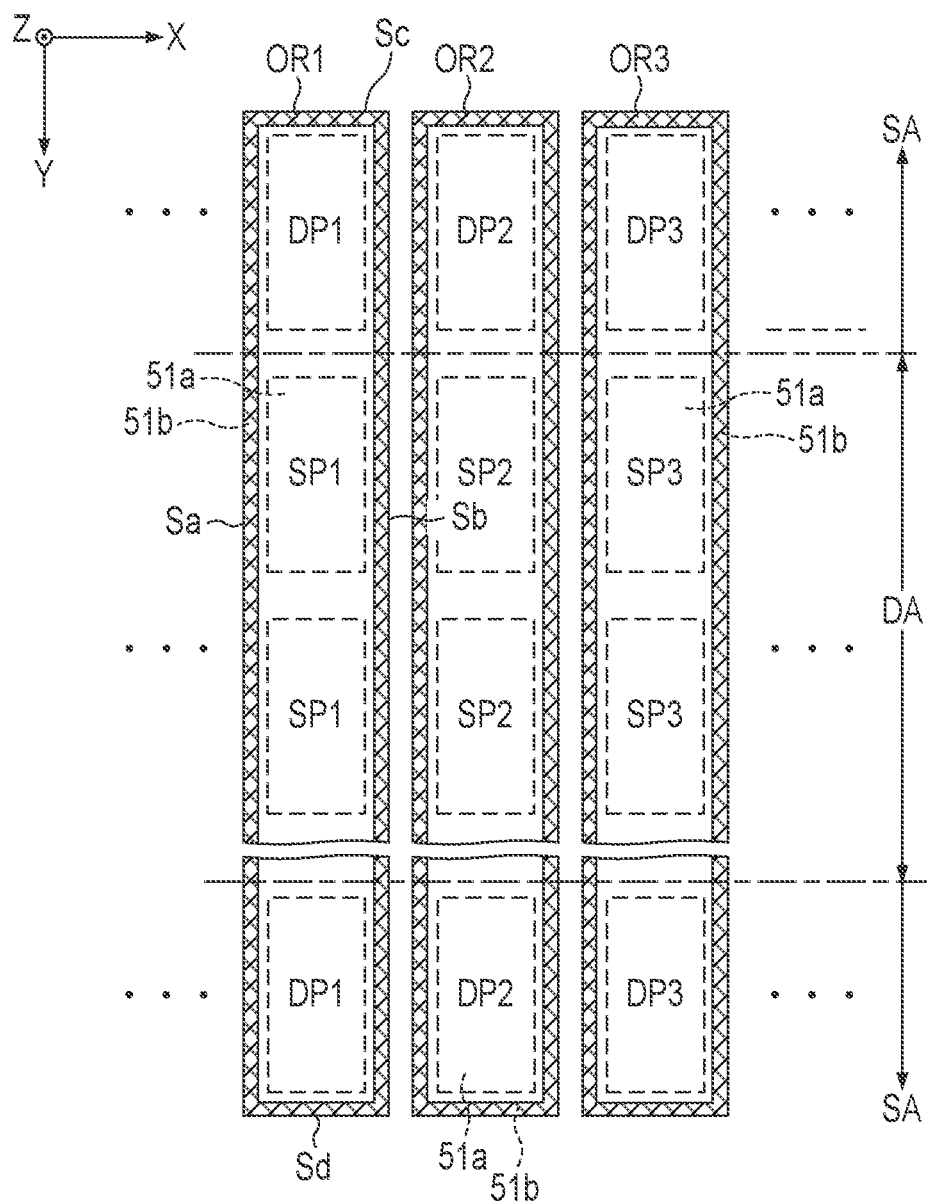
FIG. 30 is a plan view illustrating another example of a first region and a second region according to the tenth embodiment.

The shapes of the first region and the second region are not limited to those illustrated in FIG. 28. FIG. 30 is a plan view illustrating another example of the first region and the second region. In this figure, sub-pixels SP1, SP2, SP3, dummy sub-pixels DP1, DP2, DP3 and organic layers OR1, OR2, OR3 similar to those in FIG. 23 are disposed.

Each of the first carrier injection layers 51 of the organic layers OR1, OR2, and OR3 has a first region 51a and a second region 51b. In each of the organic layers OR1, OR2, and OR3, the second region 51b is annularly formed along the sides Sa, Sb, Sc, and Sd. That is, the first region 51a of the organic layer OR1 is formed over both the sub-pixel SP1 and the dummy sub-pixel DP1, the first region 51a of the organic layer OR2 is formed over both the sub-pixel SP2 and the dummy sub-pixel DP2, and the first region 51a of the organic layer OR3 is formed over both the sub-pixel SP3 and the dummy sub-pixel DP3. Note that the first region and the second region may be formed in a layer other than the first carrier injection layer 51 among the organic layers OR1, OR2, and OR3.

The organic layers OR1, OR2, and OR3 illustrated in FIG. 30 can be formed using a linear vapor deposition source as illustrated in FIG. 24. At this time, the first region and the second region can be formed in a specific layer of the organic layers OR1, OR2, and OR3 by selectively using a linear vapor deposition source for the host and a linear vapor deposition source for the dopant as in FIG. 29.

In the first to tenth embodiments described above, a configuration has been disclosed in which an organic layer OR includes a first layer having a first edge portion and a second layer located between the first layer and a second electrode E2 and having a second edge portion, and the second layer covers the first edge portion. The first layer is any layer other than an uppermost layer among layers constituting the organic layer OR, and is, for example, the first carrier injection layer 51, the first carrier transport layer 52, or the emitting layer 54 in the first embodiment. The second layer is any layer other than a lowermost layer among the layers constituting the organic layer OR, and is, for example, the first carrier blocking layer 53 or the second carrier blocking layer 55 in the first embodiment.

In the second embodiment (FIG. 16) and the third embodiment (FIG. 17), in addition to the first layer and the second layer, the organic layer OR further includes a third layer located between the second layer and the second electrode E2 and having a third edge portion, and the third layer covers the second edge portion. For example, in the second embodiment, the first layer is the first carrier injection layer 51 or the first carrier transport layer 52, the second layer is the first carrier blocking layer 53, and the third layer is the second carrier blocking layer 55.

The layer configuration of the organic layer OR disclosed in each embodiment is an example. Even in a case where the layer configuration of the organic layer OR is different from those of each embodiment, by providing the first layer and the second layer, and further additionally the third layer, the same effects as those of each embodiment can be obtained.

In each embodiment, a case where the first electrode E1 corresponds to an anode and the second electrode E2 corresponds to a cathode has been exemplified. However, even in a case where the second electrode E2 corresponds to an anode and the first electrode E1 corresponds to a cathode, by applying the same configuration as the organic layer OR disclosed in each embodiment, the same effect as each embodiment can be obtained.

Based on the display device which has been described in the above-described embodiments, a person having ordinary skill in the art may achieve a display device with an arbitral design change; however, as long as they fall within the scope and spirit of the present invention, such a display device is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A display device comprising:
    a first electrode;
    an organic layer disposed on the first electrode; and
    a second electrode covering the organic layer, wherein
    the organic layer includes:
        a first injection layer which generates a first carrier;
        a first transport layer which transports the first carrier;
        a first blocking layer which blocks a second carrier;
        an emitting layer which emits light;
        a second blocking layer which blocks the first carrier;
        a second transport layer which transports the second carrier; and
        a second injection layer which generates the second carrier;
    the first injection layer, the first transport layer, the first blocking layer, the emitting layer, the second blocking layer, the second transport layer, and the second injection layer are stacked in this order from the first electrode toward the second electrode,
    the first blocking layer covers edge portions of the first injection layer and the first transport layer, and
    an edge portion of the second blocking layer is in contact with the first blocking layer.

2. The display device of claim 1, wherein
    the edge portions of the first injection layer and the first transport layer are not in contact with the second electrode, and
    the edge portion of the first blocking layer is in contact with the second electrode.

3. The display device of claim 1, wherein
    the second blocking layer covers an edge portion of the emitting layer.

4. The display device of claim 3, wherein
    the edge portion of the second blocking layer is in contact with the second electrode.

5. The display device of claim 1, wherein
    the edge portion of the first blocking layer includes a first side and a second side, and
    the second blocking layer covers the second side and does not cover the first side.

6. The display device of claim 1, wherein
the first injection layer includes:
a first region in which a dopant is distributed at a first concentration; and
a second region located between the first region and the edge portion of the first blocking layer and in which the dopant is distributed at a second concentration lower than the first concentration.

7. The display device of claim 1, wherein
an area of the first blocking layer is larger than an area of the first injection layer in planar view.

8. The display device of claim 1, further comprising
a rib having an opening overlapping with the first electrode, wherein
the organic layer is in contact with the first electrode through the opening, and
the edge portion of the first injection layer is located on the rib.

9. The display device of claim 8, wherein
the rib covers a peripheral portion of the first electrode.

10. The display device of claim 1, further comprising:
a sub-pixel disposed in a display region for displaying an image; and
a dummy sub-pixel disposed in a peripheral region outside the display region, wherein
the organic layer is continuously disposed over the sub-pixel and the dummy sub-pixel.

11. The display device of claim 1, wherein
the first transport layer is thicker than the first injection layer.

* * * * *